United States Patent
Misaki

(10) Patent No.: US 10,580,818 B2
(45) Date of Patent: Mar. 3, 2020

(54) IMAGING PANEL AND METHOD FOR PRODUCING SAME

(71) Applicant: Sharp Kabushiki Kaisha, Sakai, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/484,131

(22) PCT Filed: Feb. 7, 2018

(86) PCT No.: PCT/JP2018/004230
§ 371 (c)(1),
(2) Date: Aug. 7, 2019

(87) PCT Pub. No.: WO2018/147332
PCT Pub. Date: Aug. 16, 2018

(65) Prior Publication Data
US 2019/0355774 A1 Nov. 21, 2019

(30) Foreign Application Priority Data
Feb. 10, 2017 (JP) .................. 2017-022757

(51) Int. Cl.
*H01L 27/146* (2006.01)
(52) U.S. Cl.
CPC .. *H01L 27/14636* (2013.01); *H01L 27/14612* (2013.01); *H01L 27/14663* (2013.01); *H01L 27/14692* (2013.01)
(58) Field of Classification Search
CPC ......... H01L 27/14636; H01L 27/14612; H01L 27/14663; H01L 27/14692
(Continued)

(56) References Cited

U.S. PATENT DOCUMENTS

| 5,859,463 A | 1/1999 | Liu et al. |
| 2013/0048863 A1 | 2/2013 | Ohta et al. |

(Continued)

FOREIGN PATENT DOCUMENTS

| JP | 10-206229 A | 8/1998 |
| JP | 2002-094040 A | 3/2002 |

(Continued)

OTHER PUBLICATIONS

Official Communication issued in International Patent Application No. PCT/JP2018/004230, dated Mar. 20, 2018.

*Primary Examiner* — Elias Ullah
(74) *Attorney, Agent, or Firm* — Keating & Bennet, LLP

(57) ABSTRACT

Provided is an X-ray imaging panel and a method for producing the same with improved productivity. An imaging panel 1 has an active area and a terminal area on a substrate 101. In the terminal area, there are provided: a first conductive layer 100; a terminal first insulating film 103 that is formed with the same material as that of a first insulating film in the active area, and has a first opening; a second conductive layer 1701 that is formed with the same material as that of a conductive film in the active area, and overlaps with the first conductive layer 100 at a position where the first opening is provided; and a cover layer provided at the position where the first opening is provided, so as to be arranged between the first conductive layer 100 and the second conductive layer 1701. The first conductive layer 100 is formed with the same material as that of any one of a gate electrode and a source electrode of a thin film transistor as well as a lower electrode in the active area. The cover layer is formed with the same material as that of at least one element arranged in an upper layer with respect to one element made of the same material as that of the first (Continued)

conductive layer 100 among the source electrode, the lower electrode, and a bias line in the active area.

11 Claims, 23 Drawing Sheets

(58) Field of Classification Search
USPC ........................................................... 257/72
See application file for complete search history.

(56) References Cited

U.S. PATENT DOCUMENTS

| | | |
|---|---|---|
| 2014/0103347 A1 | 4/2014 | Ishino |
| 2016/0118425 A1 | 4/2016 | Kurokawa |
| 2016/0172410 A1 | 6/2016 | Kurokawa |

FOREIGN PATENT DOCUMENTS

| | | |
|---|---|---|
| JP | 2004-022635 A | 1/2004 |
| JP | 2010-245076 A | 10/2010 |
| JP | 2011-159781 A | 8/2011 |
| JP | 2013-046043 A | 3/2013 |
| JP | 2014-078651 A | 5/2014 |
| JP | 2015-119113 A | 6/2015 |
| JP | 2016-086164 A | 5/2016 |
| JP | 2016-123087 A | 7/2016 |

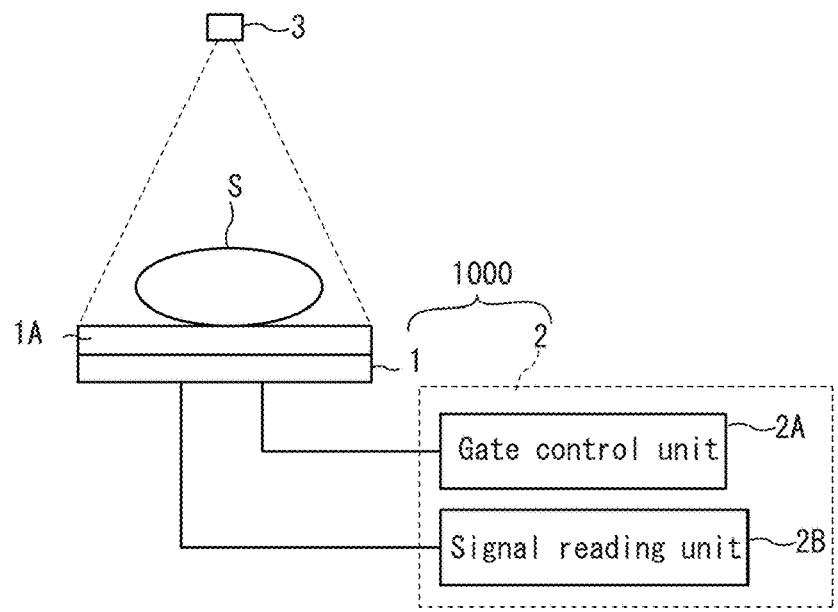
F I G. 1
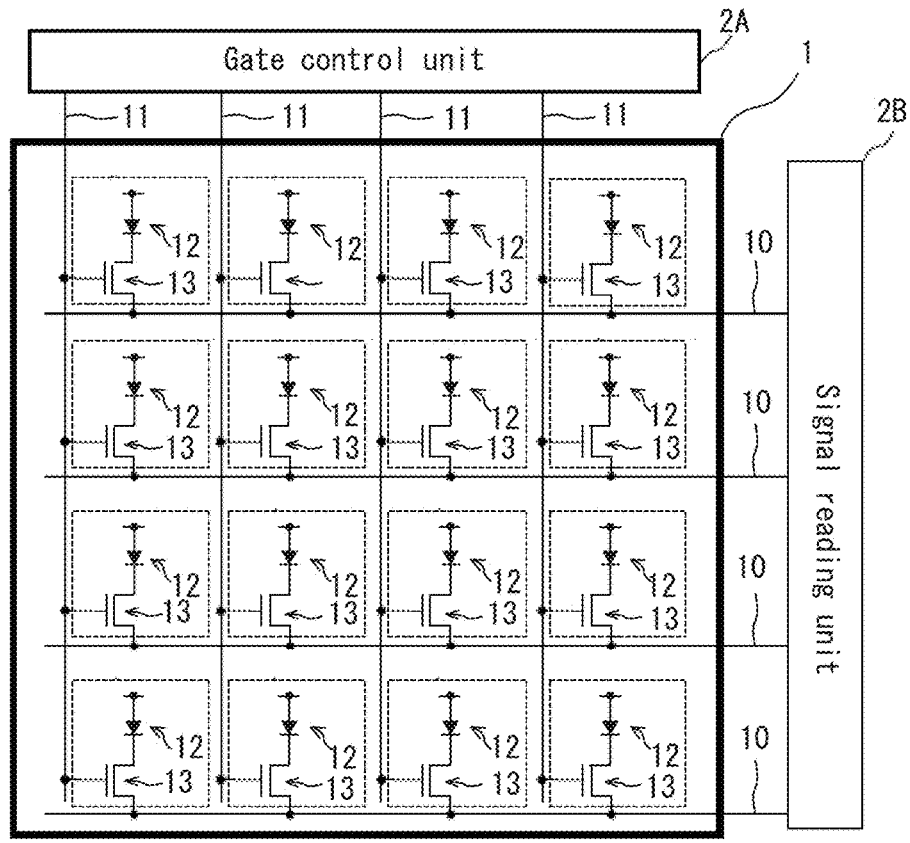
F I G. 2

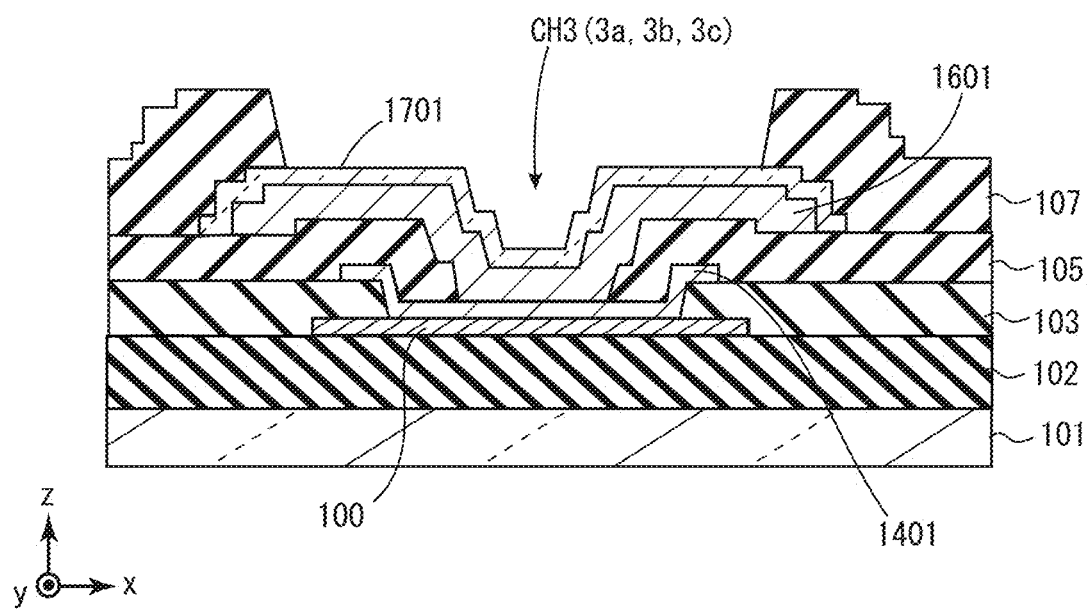
F I G. 5 A

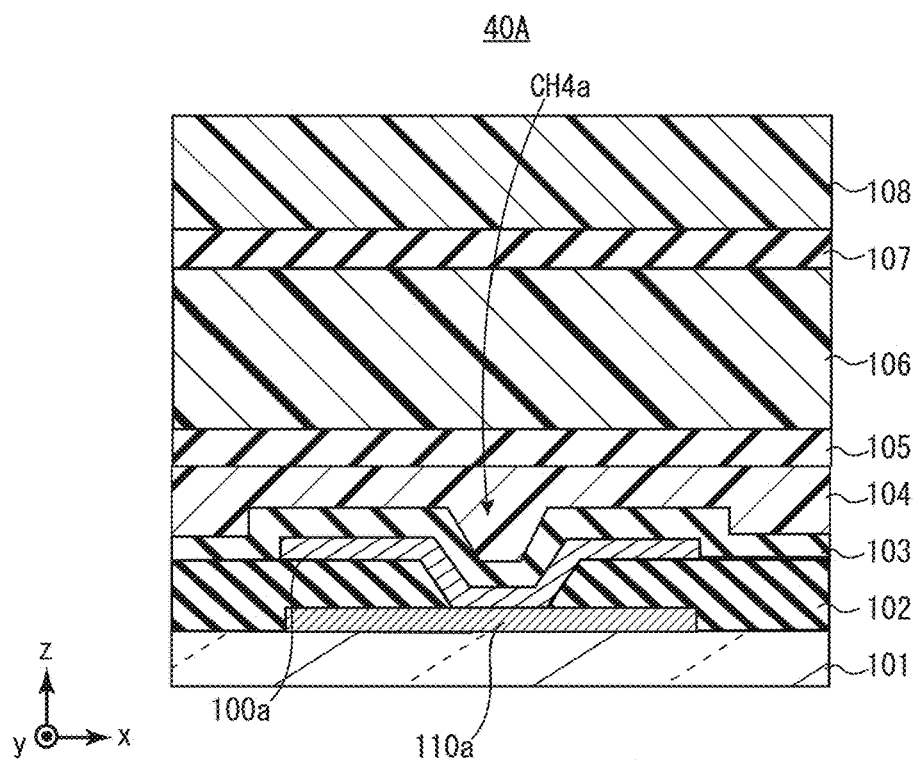
F I G. 5 B
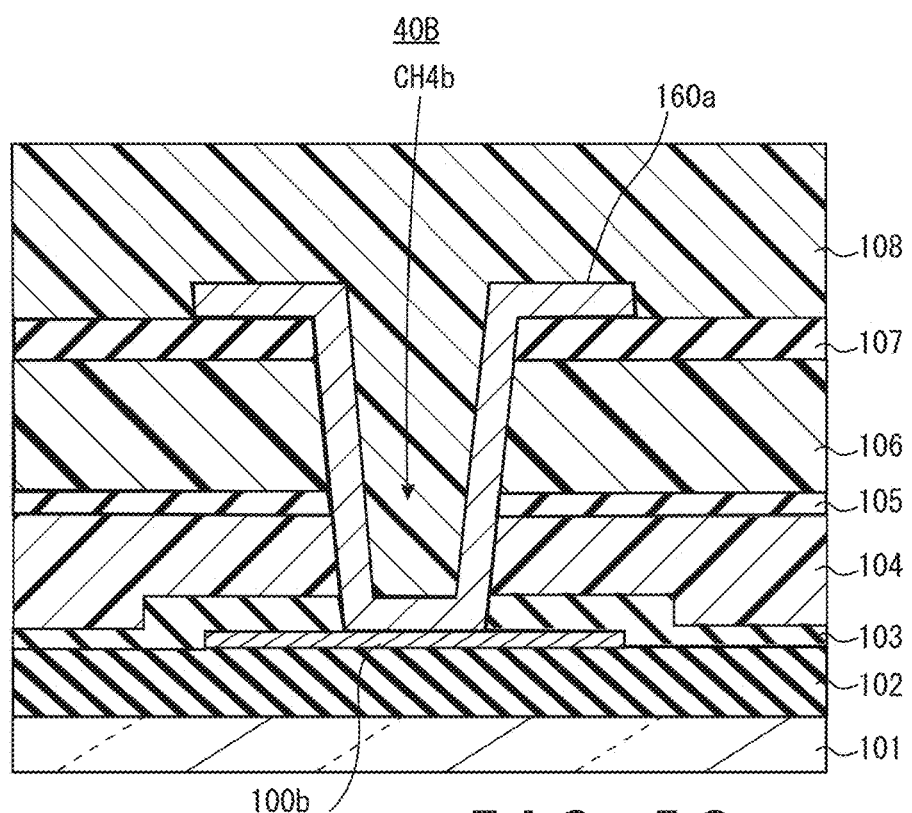
F I G. 5 C

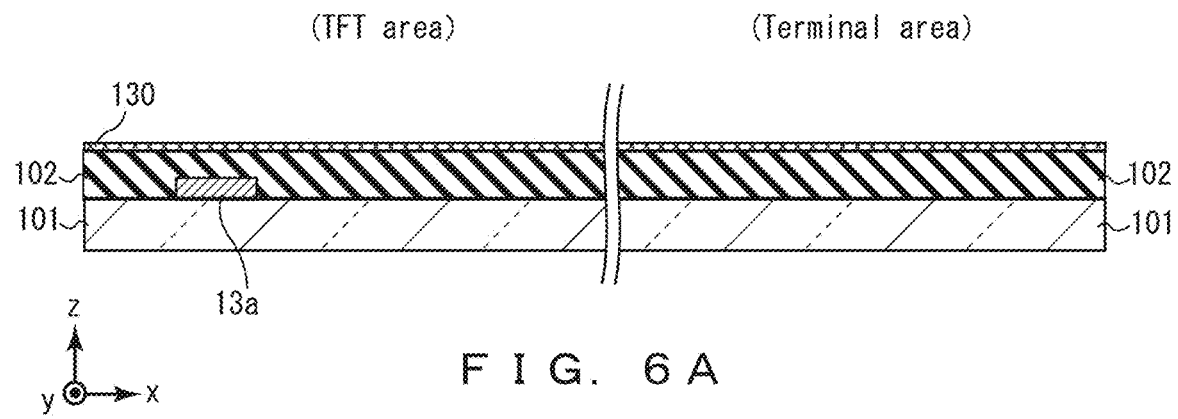
F I G. 6A
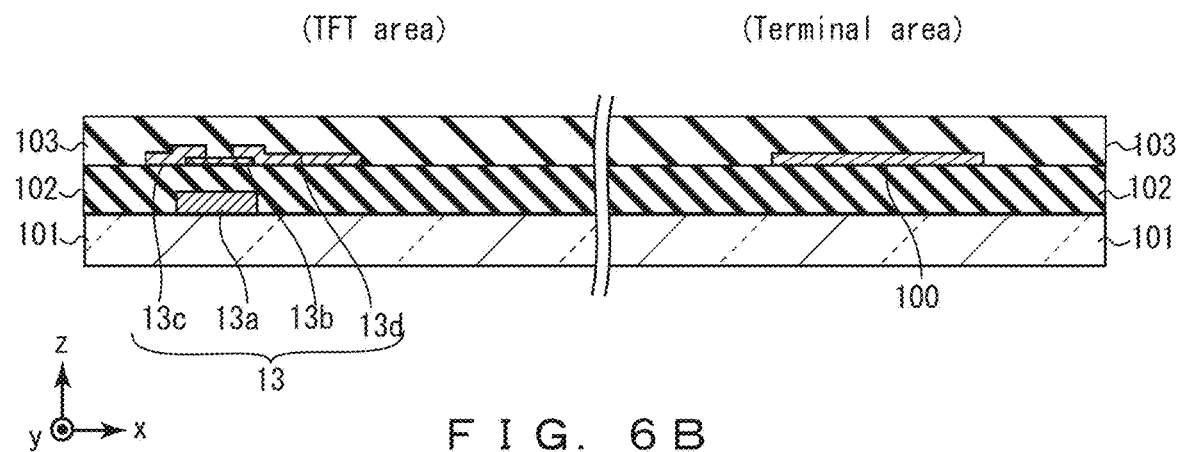
F I G. 6B
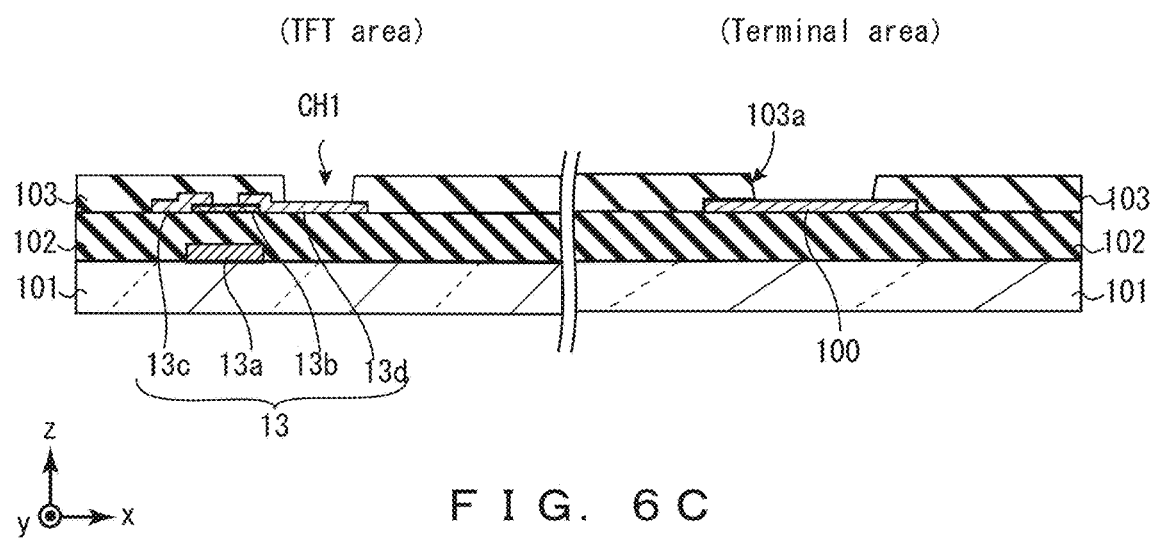
F I G. 6C

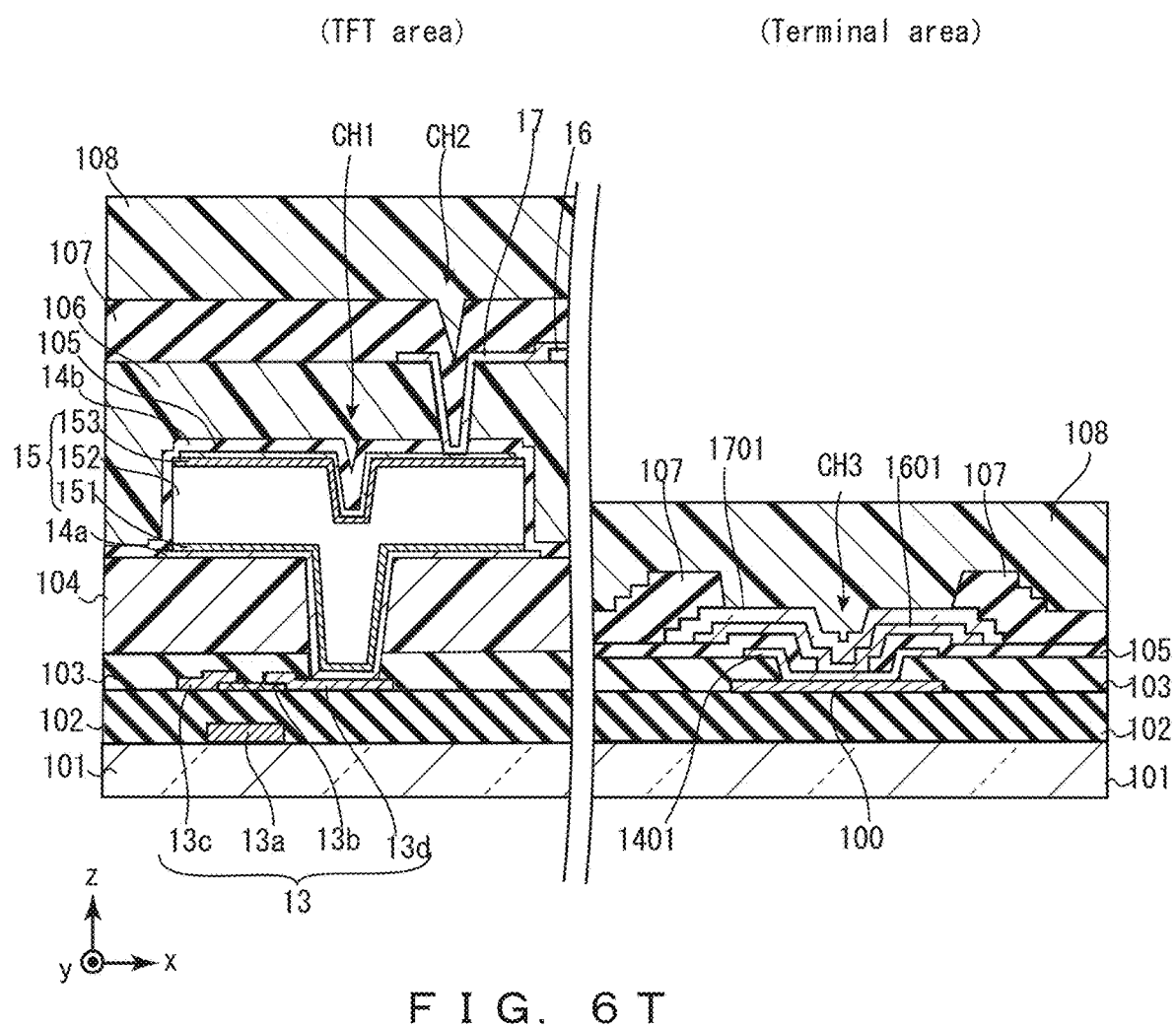
F I G. 6 T

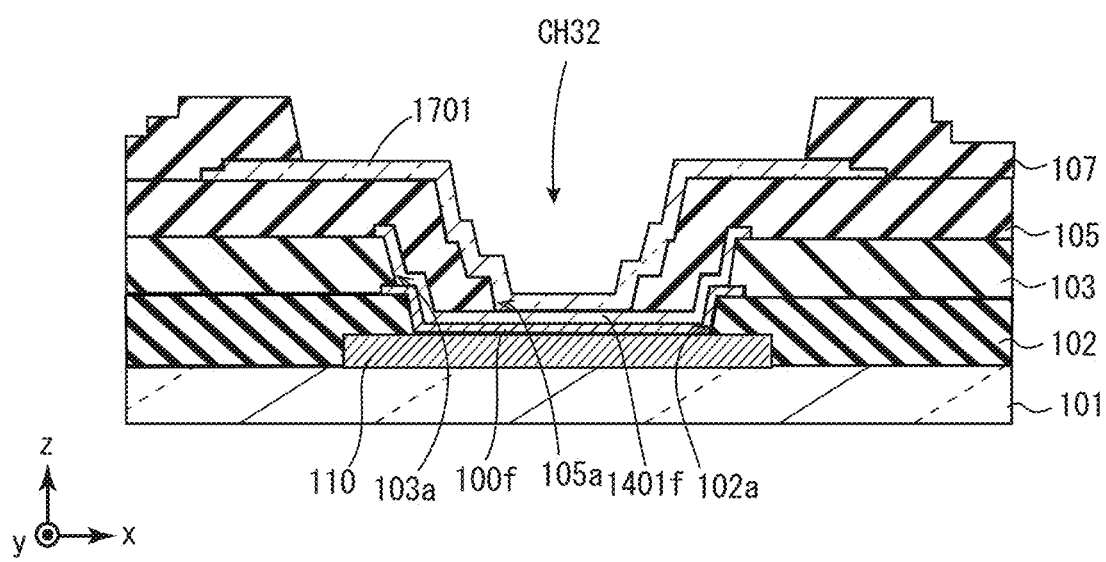
F I G. 13

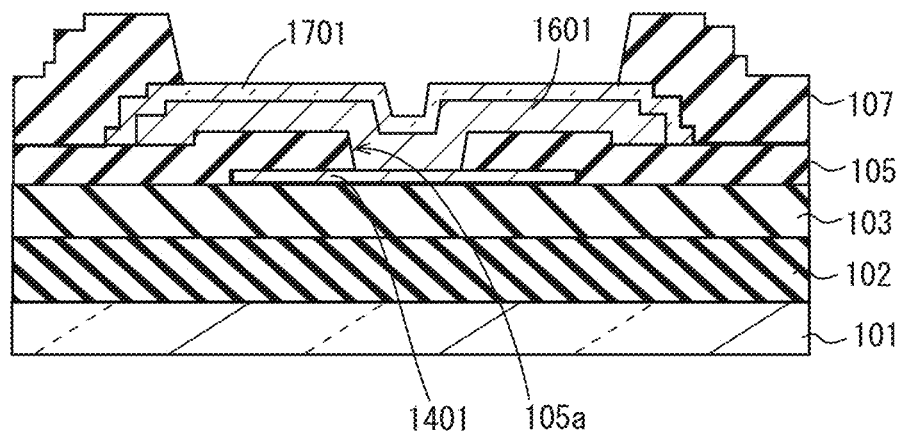
F I G. 16

IMAGING PANEL AND METHOD FOR PRODUCING SAME

TECHNICAL FIELD

The present invention relates to an imaging panel and a method for producing the same.

BACKGROUND ART

An X-ray imaging device that picks up an X-ray image with an imaging panel that includes a plurality of pixel portions is known. In such an X-ray imaging device, for example, projected X-rays are converted into charges by photodiodes. Converted charges are read out when thin film transistors (hereinafter also referred to as TFTs) are caused to operate, the TFTs being provided in the pixel portions. With the charges being read out in this way, an X-ray image is obtained. JP-A-2013-46043 discloses such an imaging panel. The photodiode in the configuration disclosed in JP-A-2013-46043 has a PIN structure in which an n-type semiconductor layer, an i-type semiconductor layer, and a p-type semiconductor layer are laminated. On the photodiode, an upper electrode formed with a transparent conductive film is provided; and under the photodiode, a lower electrode containing a metal such as aluminum is provided. The upper electrode is connected with a common electrode line for supplying a bias voltage.

SUMMARY OF THE INVENTION

By the way, it is desirable that gate electrodes and source electrodes of thin film transistors, and terminals connected with bias lines for supplying a bias voltage are produced simultaneously in the process of producing the active area where the thin film transistors and the photodiodes are provided. However, in a case where conductive films used in pad portions of the terminals are made of the same materials as those used for forming the bias lines, electrodes of photodiodes, etc. formed in the active area, it is likely in some cases that the conductive films that are to become the pad portions of the terminals would disappear in an etching step in which the bias lines, the electrodes, etc. in the active area.

It is an object of the present invention to provide an X-ray imaging panel and a method for producing the same in which terminals are surely formed at the same time when an active area is produced, thereby enabling to improve the production efficiency.

An imaging panel of the present invention that solves the above-described problems is an imaging panel that generates an image based on scintillation light that is obtained from X-rays transmitted through an object, and the imaging panel includes a substrate and has an active area and a terminal area on the substrate, and further includes, in the active area: a thin film transistor formed on the substrate; a first insulating film provided on the thin film transistor; a lower electrode provided on the first insulating film; a photoelectric conversion layer that is provided on the lower electrode and converts the scintillation light into charges; an upper electrode provided on the photoelectric conversion layer; a second insulating film arranged on the upper electrode so as to have separation to have a contact hole; a conductive film that is arranged on the second insulating film and is connected with the upper electrode through the contact hole; and a bias line that is arranged on the second insulating film and is connected with the conductive film. The imaging panel still further includes, in the terminal area: a first conductive layer that is provided on the substrate and is connected with a gate electrode or a source electrode of the thin film transistor; a terminal first insulating film that is made of the same material as that of the first insulating film or the second insulating film, and is arranged so as to have separation on a part of the first conductive layer to have a first opening; a second conductive layer that is made of the same material as that of the conductive film, is provided above the terminal first insulating film, and overlaps with the first conductive layer at a position where the first opening is provided; and a cover layer that is arranged between the first conductive layer and the second conductive layer so as to overlap with the first conductive layer and the second conductive layer at the position where the first opening is provided, wherein the first conductive layer is made of the same material as that of any one element of the gate electrode, the source electrode, and the lower electrode, and the cover layer is made of the same material as that of at least one element arranged in an upper layer with respect to the element made of the same material as that of the first conductive layer, among the source electrode, the lower electrode, and the bias line.

According to the present invention, terminals are surely formed at the same time when an active area is produced, which enables to improve the production efficiency.

BRIEF DESCRIPTION OF DRAWINGS

FIG. 1 is a schematic diagram showing an X-ray imaging device in an embodiment.

FIG. 2 is a schematic diagram showing a schematic configuration of the imaging panel shown in FIG. 1.

FIG. 5A is a cross-sectional view of the G terminal shown in FIG. 4A, taken along line B-B, as well as the S terminal and the B terminal shown therein, taken along line B'-B'.

FIG. 5B is a cross-sectional view of an S-G contact shown in FIG. 4B, taken along line C-C.

FIG. 5C is a cross-sectional view of an S-B contact shown in FIG. 4B, taken along line D-D.

FIG. 6A is a cross-sectional view for explaining a process for producing the TFT area and the terminal area, the view showing a step of forming a gate insulating film, a gate electrode as well as a gate layer, and a semiconductor layer of the TFT in this order on the substrate.

FIG. 6B is a cross-sectional view showing a step of forming a first insulating film on the semiconductor layer shown in FIG. 6A, forming a source electrode and a drain electrode in the TFT area, and forming a source layer in the terminal area.

FIG. 6C is a cross-sectional view showing a step of forming a contact hole CH1 in the TFT area shown in FIG. 6B, and an opening 103a in the terminal area.

FIG. 6T is a cross-sectional view showing a step of forming a sixth insulating film on the fifth insulating film shown in FIG. 6S.

FIG. 13 is a cross-sectional view showing an exemplary structure of a G terminal, an S terminal and a B terminal in Modification Example (5).

FIG. 16 is a cross-sectional view showing an exemplary structure of a G terminal, an S terminal and a B terminal in Modification Example (7).

MODE FOR CARRYING OUT THE INVENTION

Figure 3A:
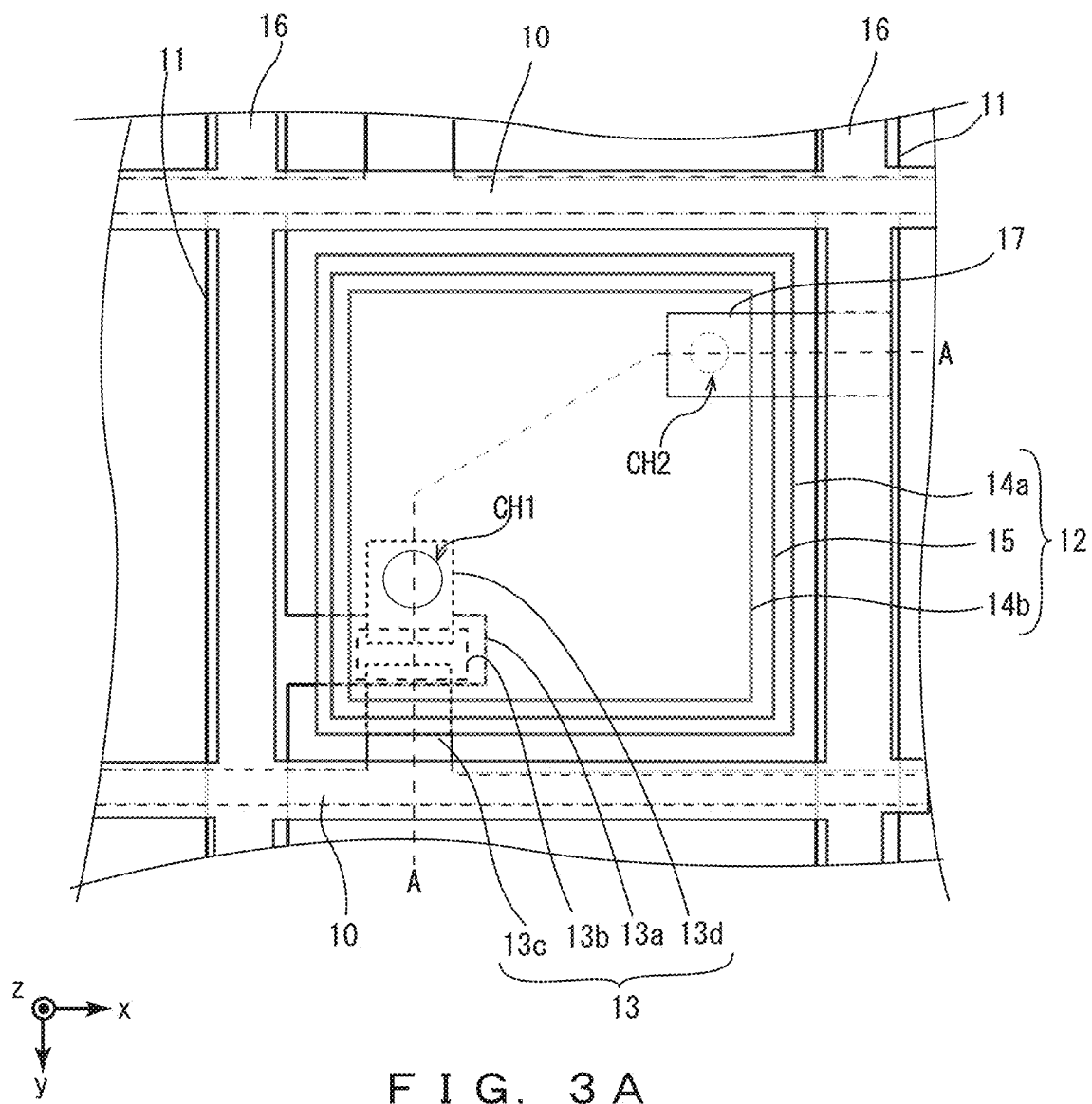
FIG. 3A is a plan view schematically showing one pixel portion of the imaging panel shown in FIG. 2.

An imaging panel according to one embodiment of the present invention is an imaging panel that generates an image based on scintillation light that is obtained from X-rays transmitted through an object, and the imaging panel includes a substrate and has an active area and a terminal area on the substrate, and further includes, in the active area: a thin film transistor formed on the substrate; a first insulating film provided on the thin film transistor; a lower electrode provided on the first insulating film; a photoelectric conversion layer that is provided on the lower electrode and converts the scintillation light into charges; an upper electrode provided on the photoelectric conversion layer; a second insulating film arranged on the upper electrode so as to have separation to have a contact hole; a conductive film that is arranged on the second insulating film and is connected with the upper electrode through the contact hole; and a bias line that is arranged on the second insulating film and is connected with the conductive film. The imaging panel still further includes, in the terminal area: a first conductive layer that is provided on the substrate and is connected with a gate electrode or a source electrode of the thin film transistor; a terminal first insulating film that is made of the same material as that of the first insulating film or the second insulating film, and is arranged so as to have separation on a part of the first conductive layer to have a first opening; a second conductive layer that is made of the same material as that of the conductive film, is provided above the terminal first insulating film, and overlaps with the first conductive layer at a position where the first opening is provided; and a cover layer that is arranged between the first conductive layer and the second conductive layer so as to overlap with the first conductive layer and the second conductive layer at the position where the first opening is provided, wherein the first conductive layer is made of the same material as that of any one element of the gate electrode, the source electrode, and the lower electrode, and the cover layer is made of the same material as that of at least one element arranged in an upper layer with respect to the element made of the same material as that of the first conductive layer, among the source electrode, the lower electrode, and the bias line (the first configuration).

According to the first configuration, the imaging panel has an active area and a plurality of terminal areas. In the terminal area, the first conductive layer, the terminal first insulating film, the second conductive layer, and the cover layer are provided on the substrate. The first conductive layer is formed with the same material as that of the gate electrode, the source electrode, or the lower electrode in the active area, and the terminal first insulating film is formed with the same material as that of the first insulating film in the active area. The second conductive layer is provided above the terminal first insulating film, is formed with the same material as that of the conductive film in the active area, and overlaps with the first conductive layer at a position where the first opening is provided. The cover layer is formed with the same material as that of at least one element arranged in an upper layer with respect to the element made of the same material as that of the first conductive layer, among the source electrode, the lower electrode, and the bias line. The cover layer is arranged between the first conductive layer and the second conductive layer so as to overlap with the first conductive layer and the second conductive layer at the position where the first opening is provided. In other words, the first conductive layer, the cover layer, and the second conductive layer are connected at the position where the first opening is provided. For this reason, it is unlikely that the first conductive layer would disappear, in the etching carried out for forming at least an element in the active area made of the same material as that of the cover layer. This makes it easier to produce the terminal area simultaneously when the active area is formed, thereby enabling to improve the production efficiency of the imaging panel. Further, the first conductive layer, the cover layer, and the second conductive layer are connected at the position where the first opening is provided, that is, at the same position when viewed in a plan view. Therefore, connection defects can be decreased, as compared with a case where the first conductive layer, the cover layer, and the second conductive layer are connected at different positions.

The first configuration may be further characterized in that, in a case where the first conductive layer is made of the same material as that of the source electrode, the cover layer is composed of a lower electrode layer made of the same material as that of the lower electrode, and a bias line layer made of the same material as that of the bias line (the second configuration).

According to the second configuration, the first conductive layer made of the same material as that of the source electrode is covered with the cover layer including the lower electrode layer and the bias line layer. Etching carried out when the lower electrode and the bias line in the active area are formed therefore does not cause the first conductive layer to disappear.

The first configuration may be further characterized in that, in a case where the first conductive layer is made of the same material as that of the gate electrode, the cover layer is composed of at least two layers of a lower electrode layer made of the same material as that of the lower electrode, a bias line layer made of the same material as that of the bias line, and a source layer made of the same material as that of the source electrode (the third configuration).

According to the third configuration, the first conductive layer made of the same material as that of the gate electrode is covered with the cover layer composed of at least two layers of the lower electrode layer, the bias line layer, and the source layer. It is therefore unlikely that the first conductive layer would disappear in etching carried out for forming the source electrode, the lower electrode, and the bias line in the active area.

Any one of the first to third configurations may be further characterized in that a plurality of terminals are provided in the terminal area, and in the terminal area, the first conductive layer in an area where at least one of the terminals is provided is connected with the gate electrode, and the first conductive layer in an area where another one of the terminals is provided is connected with the source electrode (the fourth configuration).

According to the fourth configuration, a plurality of terminals can be simultaneously produced in the step of forming the active area, which makes it possible to improve the production efficiency of the imaging panel.

Any one of the first to fourth configurations may be further characterized in that the gate electrode and the source electrode of the thin film transistor, the lower electrode, as well as the bias line contain one same material (the fifth configuration).

According to the fifth configuration, the lower electrode layer and the bias line layer made of the same material as that of the lower electrode and the bias line, respectively, are arranged on the first conductive layer so as to overlap. Etching carried out when the lower electrode and the bias line are formed therefore does not cause the first conductive layer to disappear.

An imaging panel producing method according to one embodiment of the present invention is a method for producing an imaging panel that generates an image based on scintillation light that is obtained from X-rays transmitted through an object, and the method includes the steps of, in an active area on a substrate: forming a thin film transistor; forming a first insulating film on the thin film transistor; forming, on a drain electrode of the thin film transistor, a first contact hole that passes through the first insulating film, and forming a lower electrode conductive film that covers the first insulating film; etching the lower electrode conductive film, so as to form a lower electrode on the first insulating film so that the lower electrode is connected with the drain electrode through the first contact hole; forming a photoelectric conversion layer on the lower electrode, and forming an upper electrode on the photoelectric conversion layer; forming a second insulating film that covers the upper electrode, and forming a second contact hole that pass through the second insulating film; forming a bias line conductive film above the second insulating film, and etching the bias line conductive film, so as to form a bias line to which a bias voltage is applied; and forming a conductive film that is connected with the upper electrode through the second contact hole. In the method, the step of forming the thin film transistor or the step of forming the lower electrode includes a sub-step of forming a first conductive layer in a terminal area on the substrate, the first conductive layer being made of the same material as that of any one element of the gate electrode and the source electrode of the thin film transistor, and the lower electrode; the step of forming the first insulating film or the step of forming the second insulating film includes a sub-step of forming a terminal first insulating film that is made of the same material as that of the first insulating film or the second insulating film and has a first opening on a part of the first conductive layer; the step of forming the conductive film includes a sub-step of forming a second conductive layer that is made of the same material as that of the conductive film and overlaps with the first conductive layer above the terminal first insulating film, at a position where the first opening is provided; and the step of forming at least one element arranged in an upper layer with respect to the element made of the same material as that of the first conductive layer, the at least one element being among the source electrode, the lower electrode, and the bias line, includes a sub-step of forming a cover layer that is made of the same material as that of the at least one element, and is arranged at a position where the first opening is provided, so as to be interposed between the first conductive layer and the second conductive layer (the first producing method).

According to the first producing method, in the terminal area, the first conductive layer, the terminal first insulating film, the second conductive layer and the cover layer are provided on the substrate. The first conductive layer is made of the same material as that of the gate electrode, the source electrode, or the lower electrode in the active area, and the terminal first insulating film is formed with the same material as that of the first insulating film in the active area. The second conductive layer is provided above the terminal first insulating film, is formed with the same material as that of the conductive film in the active area, and overlaps with the first conductive layer at a position where the first opening is provided. The cover layer is formed with the same material as that of at least one element arranged in an upper layer with respect to the element made of the same material as that of the first conductive layer, among the source electrode, the lower electrode, and the bias line. The cover layer is arranged between the first conductive layer and the second conductive layer so as to overlap with the first conductive layer and the second conductive layer at the position where the first opening is provided. In other words, the first conductive layer, the cover layer, and the second conductive layer are connected at the position where the first opening is provided.

For this reason, it is unlikely that the first conductive layer would disappear, in the etching carried out for forming at least an element in the active area made of the same material as that of the cover layer. This makes it easier to produce the terminal area simultaneously when the active area is formed, thereby enabling to improve the production efficiency of the imaging panel. Further, the first conductive layer, the cover layer, and the second conductive layer are connected at the position where the first opening is provided, that is, at the same position when viewed in a plan view. Therefore, connection defects can be suppressed, as compared with a case where the first conductive layer, the cover layer, and the second conductive layer are connected at different positions.

The first producing method may be further characterized in that the first conductive layer contains such a material that, in etching that is carried out in the step of forming the element arranged in an upper layer with respect to the element made of the same material as that of the first conductive layer, among the source electrode, the lower electrode, and the bias line, an etch selectivity of the material with respect to the former element is high (the second producing method).

With the second producing method, the first conductive layer does not disappear in the etching carried in the step of forming an element arranged in an upper layer with respect to a layer where the first conductive layer is provided, among the source electrode, the lower electrode, and the bias line layer.

A lowermost layer in the cover layer in contact with the first conductive layer may contain such a material that, in etching that is carried out in the step of forming an element arranged in an upper layer with respect to an element made of the same material as that of the lowermost layer among the source electrode, the lower electrode, and the bias line, an etch selectivity of the material with respect to the former element is high (the third producing method).

With the third producing method, in the etching carried in the step of forming an element arranged in an upper layer with respect to the lowermost layer in the cover layer, among the source electrode, the lower electrode, and the bias line layer, the lowermost layer does not disappear, and the first conductive layer does not disappear, either.

The third producing method may be further characterized in that the cover layer includes a source layer that is formed in the step in which the source electrode of the thin film transistor is formed and is made of the same material as that of the source electrode, and a bias line layer that is formed in the step in which the bias line is formed and is made of the same material as that of the bias line. In the terminal area, in the step of forming the second insulating film, a terminal second insulating film that is made of the same material as that of the second insulating film, covers the terminal first insulating film, and has a second opening inside the first opening, is formed; the source layer is connected with the first conductive layer at the first opening; the terminal first insulating film is formed on a part of the source layer; the bias line layer is formed on the terminal second insulating film, and is connected with the source layer at the second opening; and the second conductive layer is connected with the first conductive layer at the second opening, which overlaps with the first opening, via the cover layer (the fourth producing method).

According to the fourth producing method, the second opening in the terminal second insulating film is provided inside the first opening in the terminal first insulating film. This makes it possible to surely connect the first conductive layer and the second conductive layer at a position where the first opening and the second opening overlap, via the source layer and the bias line layer.

The fourth producing method may be further characterized in that the source electrode and the source layer are formed by laminating a first material that exhibits a high etch rate in etching carried out when the lower electrode is formed, and a second material that exhibits a low etch rate in the etching; the second insulating film and the terminal second insulating film have a thickness greater than that of the film of the first material; and the bias line and the bias line layer are formed with a plurality of layers containing the first material, and the bias line and the bias line layer have a thickness greater than that of the film of the first material in the source electrode and the source layer (the fifth producing method).

According to the fifth producing method, the first material in the source layer is easily etched in the etching carried out when the lower electrode is formed, but the thickness of the terminal second insulating film and the bias line layer is greater than the thickness of the film of the first material in the source layer. In a case where the terminal first insulating film is formed so as to overlap with a part of the source layer, even if the first material in the source layer disappear in the etching carried out when the lower electrode is formed and clearance is formed between the terminal first insulating film and the source layer, the clearance portion can be covered with the terminal second insulating film. Besides, a part of the terminal second insulating film and the second opening can be surely covered with the bias line layer, which makes it possible to allow second conductive layer to be surely connected with the first conductive layer, via the bias line layer and the source layer at the second opening.

The first producing method may be further characterized in that the element not used for forming the cover layer, among the source electrode, the lower electrode, and the bias line, has a laminate structure obtained by laminating a plurality of materials, and in etching carried out in the step of forming the said element, an etch selectivity of the lowermost layer of the laminate structure with respect to elements provided in a lower layer with respect to the said element is low (the sixth producing method).

According to the sixth producing method, the material in the lowermost layer among the materials of the element not used for forming the cover layer is more easily etched as compared with an element provided in a lower layer with respect to the said element, and the time required for etching the same is short. It is therefore unlikely that the first conductive layer, which is to become the cover layer and the pad portion, would disappear.

The following description describes embodiments of the present invention in detail, while referring to the drawings. Identical or equivalent parts in the drawings are denoted by the same reference numerals, and the descriptions of the same are not repeated.

Embodiment 1

(Configuration)

FIG. 1 is a schematic diagram showing an X-ray imaging device in the present embodiment. The X-ray imaging device 1000 includes an imaging panel 1 and a control unit 2. The control unit 2 includes a gate control unit 2A and a signal reading unit 2B. X-rays are irradiated from the X-ray source 3 to an object S, and X-rays transmitted through the object S are converted into fluorescence (hereinafter referred to as scintillation light) by a scintillator 1A provided above the imaging panel 1. The X-ray imaging device 1000 acquires an X-ray image by picking up the scintillation light with the imaging panel 1 and the control unit 2.

FIG. 2 is a schematic diagram showing a schematic configuration of the imaging panel 1. As shown in FIG. 2, a plurality of source lines 10, and a plurality of gate lines 11 intersecting with the source lines 10 are formed in the imaging panel 1. The gate lines 11 are connected with the gate control unit 2A, and the source lines 10 are connected with the signal reading unit 2B.

The imaging panel 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light.

The gate lines 11 in the imaging panel 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

FIG. 3A is an enlarged plan view of one pixel portion of the imaging panel 1 shown in FIG. 2. As shown in FIG. 3A, in the pixel surrounded by the gate lines 11 and the source lines 10, a lower electrode 14a, a photoelectric conversion layer 15, and an upper electrode 14b that compose the photodiode 12 are arranged so as to overlap with one another. Further, a bias line 16 is arranged so as to overlap with the gate line 11 and the source line 10 when viewed in a plan view. The bias line 16 supplies a bias voltage to the photodiode 12. The TFT 13 includes a gate electrode 13a integrated with the gate line 11, a semiconductor active layer 13b, a source electrode 13c integrated with the source line 10, and a drain electrode 13d. In the pixel, a contact hole CH1 for connecting the drain electrode 13d and the lower electrode 14a with each other is provided. Further, in the pixel, a transparent conductive film 17 is provided so as to overlap with the bias line 16, and a contact hole CH2 for connecting the transparent conductive film 17 and the upper electrode 14b with each other is provided.

Figure 3B:
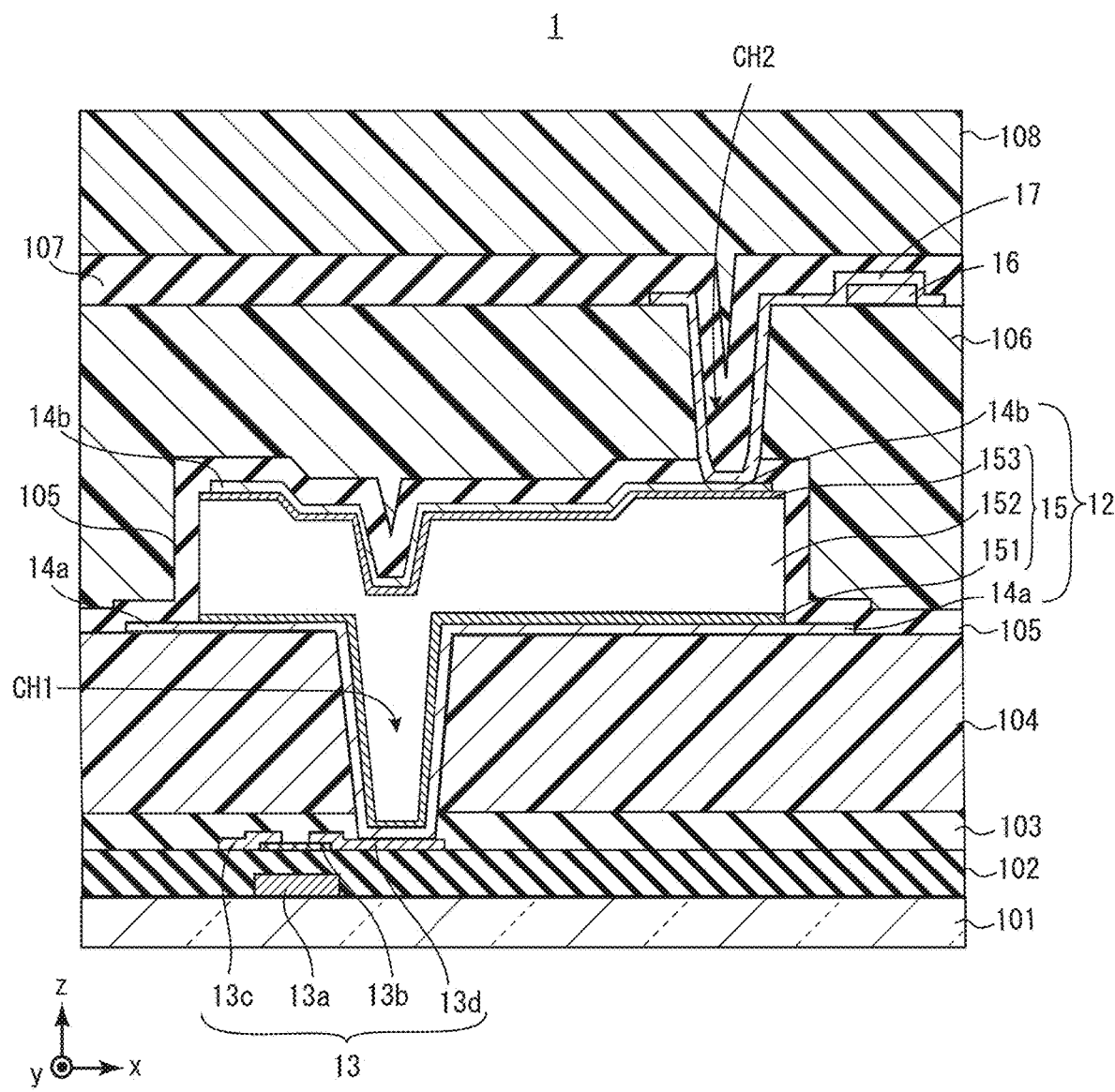
FIG. 3B is a cross-sectional view of the pixel shown in FIG. 3A, taken along the line A-A.

Here, FIG. 3B shows a cross section of the pixel shown in FIG. 3A, taken along a line A-A. As shown in FIG. 3B, the TFT 13 is formed on the substrate 101. The substrate 101 is a substrate having insulating properties, for example, a glass substrate, a silicon substrate, a plastic substrate having heat-resisting properties, a resin substrate, or the like.

Further, on the substrate 101, the gate electrode 13a integrated with the gate line 11 is formed. The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present embodiment, the gate electrode 13a and the gate line 11 have a laminate structure in which a metal film made of molybdenum nitride and a metal film made of aluminum are laminated in this order. Regarding thicknesses of these metal films, for example, the metal film made of molybdenum nitride has a thickness of 100 nm, and the metal film made of aluminum has a thickness of 300 nm.

A gate insulating film 102 is provided on the substrate 101, and covers the gate electrode 13a. The gate insulating film 102 may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In the present embodiment, the gate insulating film 102 is formed with a laminate film obtained by laminating silicon oxide ($SiO_x$) and silicon nitride ($SiN_x$) in the order, and regarding the thicknesses of these films, the film of silicon oxide ($SiO_x$) has a thickness of 50 nm, and the film of silicon nitride ($SiN_x$) has a thickness of 400 nm.

The semiconductor active layer 13b, as well as the source electrode 13c and the drain electrode 13d connected with the semiconductor active layer 13b are formed on the gate electrode 13a with the gate insulating film 102 being interposed therebetween.

The semiconductor active layer 13b is formed in contact with the gate insulating film 102. The semiconductor active layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); InSnZnO (containing indium (In), tin (Sn), and zinc (Zn)); material based on indium (In)-aluminum (Al)-zinc (Zn)-oxygen (O); or an amorphous oxide semiconductor containing indium (In), gallium (Ga), and zinc (Zn) at a predetermined ratio. Further, as an oxide semiconductor, "amorphous" materials, and "crystalline" materials (including polycrystalline materials, microcrystalline materials, and c-axis alignment crystalline materials) are applicable. In the case of the laminate structure, any combination is applicable (any particular combination is not excluded). In the present embodiment, the semiconductor active layer 13b is made of an amorphous oxide semiconductor containing indium (In), gallium (Ga), and zinc (Zn) at a predetermined ratio, and has a thickness of, for example, 70 nm. By applying a semiconductor active layer 13b, and an oxide semiconductor containing indium (In), gallium (Ga), zinc (Zn), and oxygen (O), off-leakage current of the TFT 13 can be reduced, as compared with amorphous silicon (a-Si). When off-leakage current of the TFT 13 is small, off-leakage current of the photoelectric conversion layer 15 is reduced, whereby quantum efficiency (QE) of the photoelectric conversion layer 15 is improved, which results in that the X-ray detection sensitivity can be improved.

The source electrode 13c and the drain electrode 13d are formed in contact with the semiconductor active layer 13b and the gate insulating film 102. The source electrode 13c is integrated with the source line 10. The drain electrode 13d is connected with the lower electrode 14a through the contact hole CH1.

The source electrode 13c and the drain electrode 13d are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, or a metal nitride of any of these. Further, as the material for the source electrode 13c and the drain electrode 13d, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

The source electrode 13c and the drain electrode 13d may be, for example, a laminate of a plurality of metal films. More specifically, the source electrode 13c, the source line 10, and the drain electrode 13d have a laminate structure in which a metal film made of molybdenum nitride (MoN), a metal film made of aluminum (Al), and a metal film made of molybdenum nitride (MoN) are laminated in this order. Regarding the thicknesses of the films, the metal film in the lower layer, which is made of molybdenum nitride (MoN), has a thickness of 100 nm, the metal film made of aluminum (Al) has a thickness of 500 nm, and the metal film in the upper layer, which is made of molybdenum nitride (MoN), has a thickness of 50 nm.

A first insulating film 103 is provided so as to cover the source electrode 13c and the drain electrode 13d. The first insulating film 103 may have a single layer structure made of silicon oxide ($SiO_2$) or silicon nitride (SiN), or a laminate structure obtained by laminating silicon nitride (SiN) and silicon oxide ($SiO_2$) in this order.

On the first insulating film 103, a second insulating film 104 is formed. The second insulating film 104 is made of an organic transparent resin, for example, acrylic resin or siloxane-based resin, and has a thickness of, for example, 2.5 μm.

On the drain electrode 13d, the contact hole CH1, passing through the second insulating film 104 and the first insulating film 103, is formed.

The lower electrode 14a connected with the drain electrode 13d through the contact hole CH1 is formed on the second insulating film 104. The lower electrode 14a is formed with, for example, a metal film made of molybdenum nitride (MoN), and has a thickness of, for example, 200 μm.

Further, the photoelectric conversion layer 15, whose width in X-axis direction is smaller than that of the lower electrode 14a, is formed on the lower electrode 14a. The photoelectric conversion layer 15 has a PIN structure that is obtained by laminating an n-type amorphous semiconductor layer 151, an intrinsic amorphous semiconductor layer 152, and a p-type amorphous semiconductor layer 153 in the order.

The n-type amorphous semiconductor layer 151 is made of amorphous silicon doped with an n-type impurity (for example, phosphorus). The n-type amorphous semiconductor layer 151 has a thickness of, for example, 30 nm.

The intrinsic amorphous semiconductor layer 152 is made of intrinsic amorphous silicon. The intrinsic amorphous semiconductor layer 152 is formed in contact with the n-type amorphous semiconductor layer 151. The intrinsic amorphous semiconductor layer has a thickness of, for example, 1000 nm.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152. The p-type amorphous semiconductor layer 153 has a thickness of, for example, 5 nm.

On the p-type amorphous semiconductor layer 153, the upper electrode 14b is formed. The upper electrode 14b has a smaller width in the X-axis direction than that of the photoelectric conversion layer 15. The upper electrode 14b is made of, for example, indium tin oxide (ITO), and has a thickness of, for example, 70 nm.

A third insulating film 105 is formed so as to cover the photodiode 12. The third insulating film 105 is, for example, an inorganic insulating film made of silicon nitride (SiN), and has a thickness of, for example, 300 nm.

In the third insulating film 105, a contact hole CH2 is formed at such a position that the contact hole CH2 overlaps with the upper electrode 14b. On the third insulating film 105, in an area thereof except for the contact hole CH2, a fourth insulating film 106 is formed. The fourth insulating film 106 is formed with an organic transparent resin made of, for example, acrylic resin or siloxane-based resin, and has a thickness of, for example, 2.5 μm.

On the fourth insulating film 106, the bias line 16 is formed. Further, on the fourth insulating film 106, the transparent conductive film 17 is formed so as to overlap with the bias line 16. The transparent conductive film 17 is in contact with the upper electrode 14b at the contact hole CH2. The bias line 16 is connected to the control unit 2 (see FIG. 1). The bias line 16 applies a bias voltage through the contact hole CH2 to the upper electrode 14b, the bias voltage being input from the control unit 2. The bias line 16 has a laminate structure that is obtained by laminating, for example, a metal film made of molybdenum nitride (MoN), a metal film made of aluminum (Al), and a metal film made of titanium (Ti) in this order. The films of molybdenum nitride (MoN), aluminum (Al), and titanium (Ti) have thicknesses of, for example, 100 nm, 300 nm, and 50 nm, respectively.

On the fourth insulating film 106, a fifth insulating film 107 is formed so as to cover the transparent conductive film 17. The fifth insulating film 107 is an inorganic insulating film made of, for example, silicon nitride (SiN), and has a thickness of, for example, 200 nm.

On the fifth insulating film 107, a sixth insulating film 108 is formed. The sixth insulating film 108 is made of, for example, an organic transparent resin such as acrylic resin or siloxane-based resin, and has a thickness of, for example, 2.0 μm.

Figure 4A:
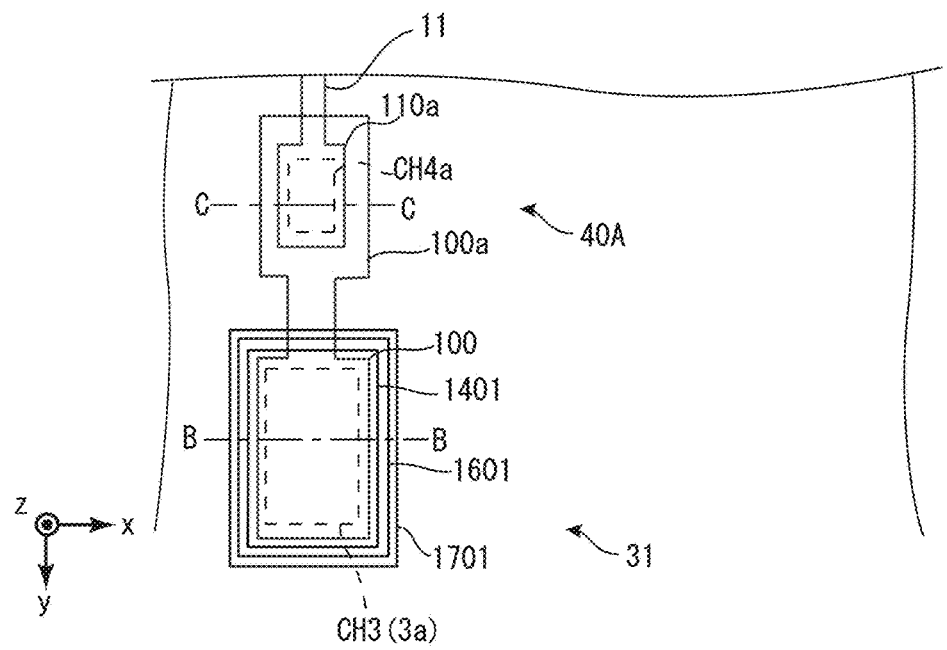
FIG. 4A is a plan view schematically showing a G terminal area in the imaging panel shown in FIG. 1.
Figure 4B:
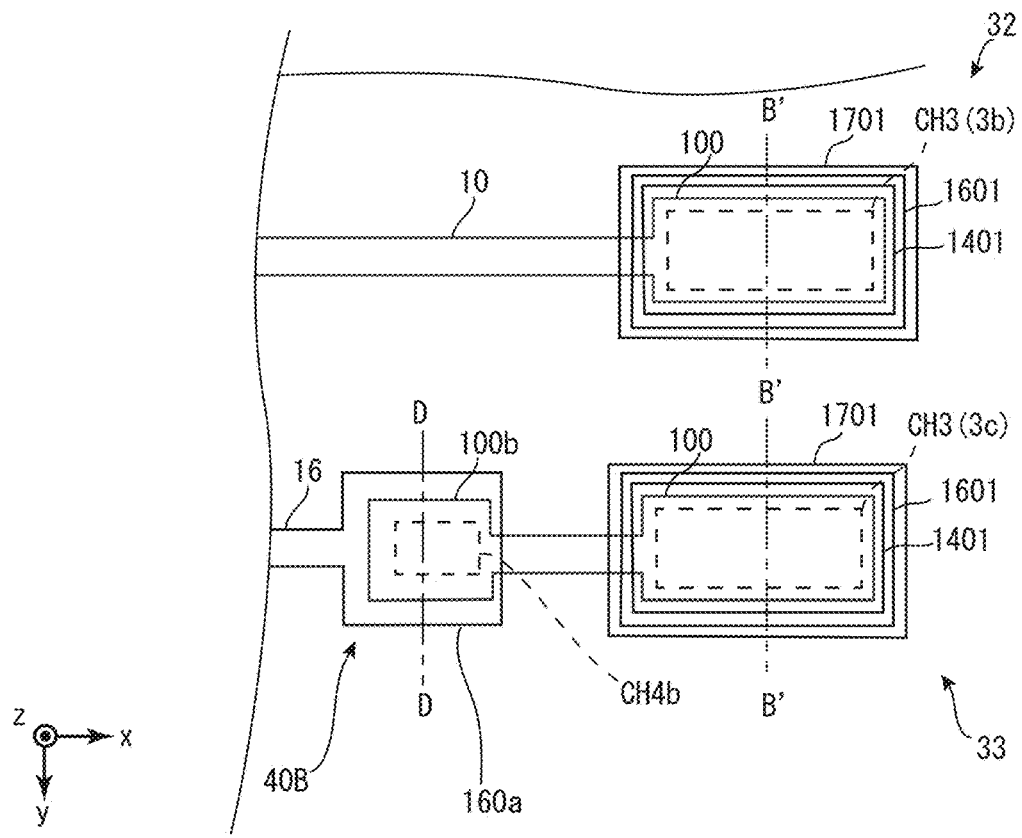
FIG. 4B is a plan view schematically showing an S terminal area and a B terminal area in the imaging panel shown in FIG. 1.

FIGS. 4A and 4B are enlarged plan views of a part of an area outside the pixel area (hereinafter referred to as an "active area") of the imaging panel 1. FIG. 4A shows an area (G terminal area) where the following are provided: a terminal (hereinafter referred to as a G terminal) 31 for connecting the gate electrode 13a and the gate line 11 shown in FIG. 3A with the gate control unit 2A (see FIG. 1); and a contact (S-G contact) 40A for connecting the G terminal 31 and the gate line 11.

FIG. 4B shows the following areas: an area where a terminal (hereinafter referred to as an "S terminal") 32 for connecting the source electrode 31c and the source line 10 shown in FIG. 3A with the signal reading part 2B (see FIG. 1), and a terminal (hereinafter referred to as a "B terminal") 33 for connecting the bias line 16 shown in FIG. 3A with the control unit 2, are provided; and an area (SB terminal area) where a contact (hereinafter referred to as an "S-B contact") 40B for connecting the B terminal 33 with the bias line 16 is provided.

FIG. 5A is a cross-sectional view of the G terminal 31 taken along line B-B, as well as the S terminal 32 and the B terminal 33 taken along line B'-B' shown in FIGS. 4A and 4B. FIG. 5B is a cross-sectional view of the S-G contact 40A shown in FIG. 4A, taken along line C-C, and FIG. 5C is a cross-sectional view of the S-B contact 40B shown in FIG. 4B, taken along line D-D. The following description describes the configurations of the G terminal 31, the S terminal 32, the B terminal 33, the S-G contact 40A, and the S-B contact 40B, while referring to FIGS. 5A to 5C.

(G Terminal 31, S Terminal 32, B Terminal 33)

As shown in FIG. 5A, the G terminal 31, the S terminal 32, and the B terminal 33 (hereinafter referred to as terminals 31 to 33, respectively) have a common structure.

More specifically, each of the terminals 31 to 33 has such a configuration that a gate insulating film 102 is arranged on the substrate 101. The gate insulating film 102 is integrally provided with the gate insulating film 102 provided in the active area (see FIG. 3B).

On the gate insulating film 102, a source layer 100 is arranged. The source layer 100 is formed with the same material as that for the source electrode 13c and the source line 10 provided in the active area (see FIG. 3A).

On the source layer 100, the first insulating film 103 is arranged so as to have separation so that the contact hole CH3 (CH3a, CH3b, CH3b) is provided. The first insulating film 103 in each of the terminals 31 to 33 is formed integrally with the first insulating film 103 provided in the active area (see FIG. 3B).

On the first insulating film 103, a lower electrode layer 1401 connected with the source layer 100 through the contact hole CH3 is arranged. The lower electrode layer 1401 is formed with the same material as that of the lower electrode 14a provided in the active area (see FIG. 3B).

On the lower electrode layer 1401 and the first insulating film 103, the third insulating film 105 is arranged. The third insulating film 105 in each of the terminals 31 to 33 is integrally formed with the third insulating film 105 provided in the active area (see FIG. 3B).

On the third insulating film 105, a bias line layer 1601 connected with the lower electrode layer 1401 at the contact hole CH3 is arranged. The bias line layer 1601 is formed with the same material as that of the bias line 16 provided in the active area (see FIG. 3B).

On the bias line layer 1601, a transparent conductive film 1701 is arranged. The transparent conductive film 1701 is formed with the same material as that of the transparent conductive film 17 provided in the active area (see FIG. 3B).

On the transparent conductive film 1701, outside the contact hole CH3, the fifth insulating film 107 is arranged so as to have separation. The fifth insulating film 107 in each of the terminals 31 to 33 is integrally formed with the fifth insulating film 107 provided in the active area (see FIG. 3B).

(S-G Contact)

As shown in FIG. 4A, the source layer 100 in the G terminal 31 is connected with the gate line 11 at the S-G contact 40A. As shown in FIG. 5B, in the S-G contact 40A, a gate layer 110a made of the same material as that of the gate line 11 is arranged on the substrate 101, and a gate insulating film 102 is arranged on the gate layer 110a so as to have separation so that a contact hole CH4a is formed. On the gate insulating film 102, a source layer 100a connected with the gate layer 110a through the contact hole CH4a is arranged. The source layer 100a is formed with the same material as that of the source layer 100.

On the source layer 100a, the first insulating film 103 is arranged so as to cover the source layer 100a. On the first insulating film 103, the following are laminated in the stated order: the second insulating film 104; the third insulating film 105; the fourth insulating film 106; the fifth insulating film 107; and the sixth insulating film 108. The first insulating film 103, the second insulating film 104, the third insulating film 105, the fourth insulating film 106, the fifth insulating film 107, and the sixth insulating film 108 in the S-G contact 40A are formed with the same materials as those of the first insulating film 103, the second insulating film 104, the third insulating film 105, the fourth insulating film 106, the fifth insulating film 107, and the sixth insulating film 108 arranged in the active area, respectively (see FIG. 3B).

(S-B Contact)

As shown in FIG. 4B, the source layer 100 in the B terminal 33 is connected with the bias line 16 at the S-B contact 40B. In the S-B contact 40B, as shown in FIG. 5C, the source layer 100a and the transparent conductive film 160a formed with the same material as that of the bias line 16 are connected through a contact hole CH4b. On the source layer 100a, the following are laminated in the stated order: the first insulating film 103; the second insulating film 104; the third insulating film 105; the fourth insulating film 106; the fifth insulating film 107; and the sixth insulating film 108. The contact hole CH4b passes through the first insulating film 103, the second insulating film 104, the third insulating film 105, the fourth insulating film 106, and the fifth insulating film 107, on the source layer 100a. The first insulating film 103, the second insulating film 104, the third insulating film 105, the fourth insulating film 106, the fifth insulating film 107, and the sixth insulating film 108 in the S-B contact 40B are formed with the same materials as those of the first insulating film 103, the second insulating film 104, the third insulating film 105, the fourth insulating film 106, the fifth insulating film 107, and the sixth insulating film 108 arranged in the active area, respectively (see FIG. 3B).

(Method for Producing Imaging Panel 1)

Next, the following description describes a method for producing the imaging panel 1. FIGS. 6A to 6U are cross-sectional views that respectively show steps in the process for producing the TFT area where the TFT 13 is provided, and the terminal area where the terminals 31 to 33 are provided, in the active area of the imaging panel 1.

As shown in FIG. 6A, a metal film made of molybdenum nitride and a metal film made of aluminum are formed on the substrate 101 in the stated order by, for example, sputtering. Photolithography and wet etching are carried out so that the metal film is patterned. Through these steps, the gate electrode 13a is formed in the TFT area. Simultaneously when the gate electrode 13a is formed, the gate line 11 (see FIG.

3A) is formed. Then, the gate insulating film 102 obtained by laminating silicon oxide ($SiO_x$) and silicon nitride ($SiN_x$) in the order is formed so as to cover the gate electrode 13a. Thereafter, on the gate insulating film 102, the semiconductor layer 130 formed with amorphous oxide semiconductor containing indium (In), gallium (Ga), and zinc (Zn) at a predetermined ratio is formed.

Subsequently, photolithography and dry etching are carried out so that the semiconductor layer 130 is patterned, whereby the semiconductor active layer 13b is formed in the TFT area and the semiconductor layer 130 in the terminal area is removed. Thereafter, films of molybdenum nitride (MoN), aluminum (Al), and molybdenum nitride (MoN) are laminated in the order by, for example, sputtering on the gate insulating film 102 in the TFT area and the terminal area so as to cover the semiconductor active layer 13b. Then, photolithography and wet etching are carried out so that these metal films are patterned. Through these steps, in the TFT area, the source electrode 13c and the drain electrode 13d are formed so as to be separated from each other on the semiconductor active layer 13b, whereby the TFT 13 is formed. Further, in the terminal area, the source layer 100 is formed on the gate insulating film 102. Then, the first insulating film 103 made of silicon nitride (SiN) is formed so as to cover the TFT 13 and the source layer 100 by, for example, plasma CVD (see FIG. 6B).

Subsequently, a heat treatment at about 350° C. is applied to an entire surface of the substrate 101, and photolithography and wet etching are carried out so that the first insulating film 103 is patterned. Through these steps, a contact hole CH1 is formed on the drain electrode 13d in the TFT area, and an opening 103a in the first insulating film 103 is formed on the source layer 100 in the terminal area (see FIG. 6C).

Figure 6D:
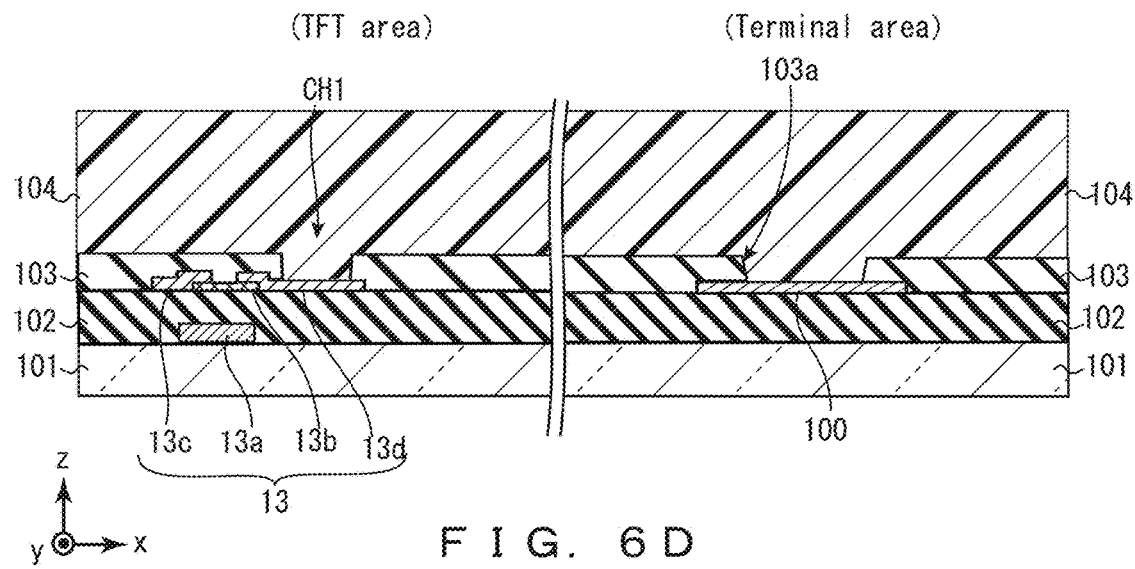
FIG. 6D is a cross-sectional view showing a step of forming a second insulating film on the first insulating film shown in FIG. 6C.

Next, the second insulating film 104 made of acrylic resin or siloxane-based resin is formed on the first insulating film 103 by, for example, slit coating (see FIG. 6D).

Figure 6E:
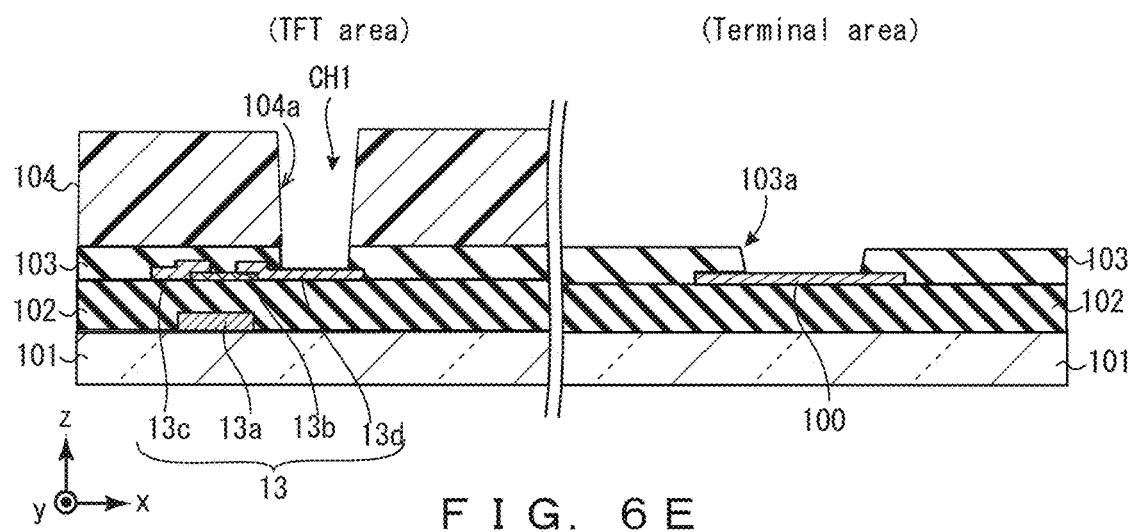
FIG. 6E is a cross-sectional view showing a step of forming an opening in the second insulating film in the TFT area shown in FIG. 6D.
Figure 6F:
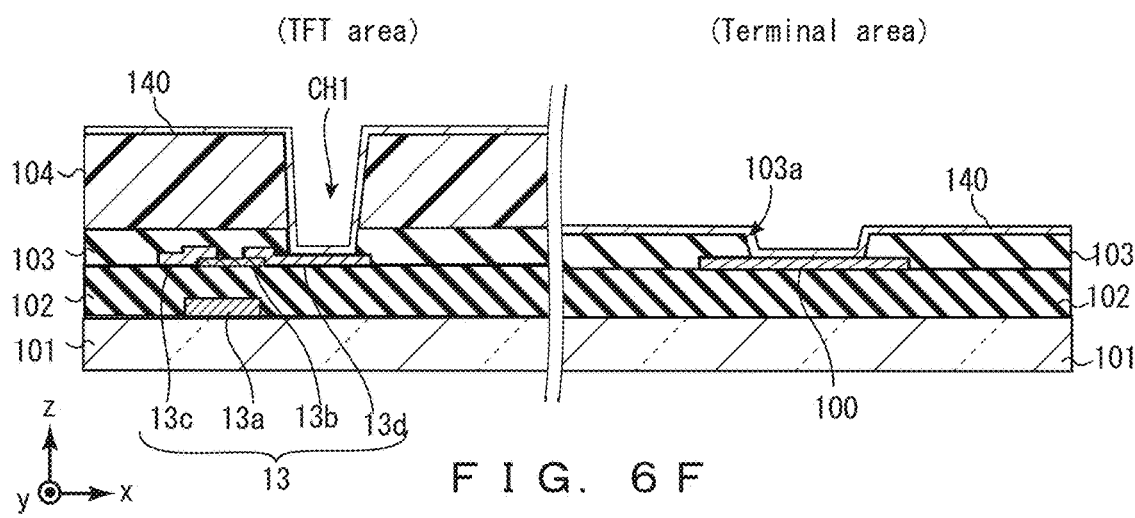
FIG. 6F is a cross-sectional view showing a step of forming a metal film in the TFT area and the terminal area shown in FIG. 6E.
Figure 6G:
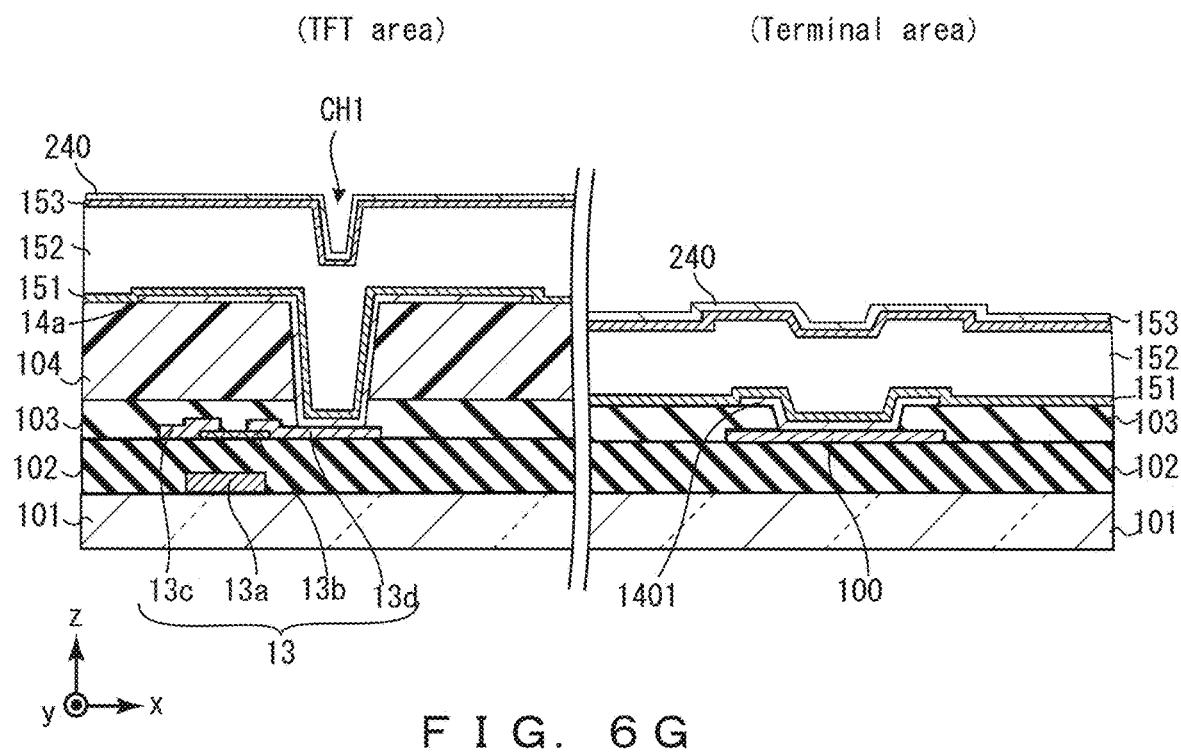
FIG. 6G is a cross-sectional view showing a step of forming a lower electrode in the TFT area shown in FIG. 6F, forming a lower electrode layer in the terminal area, and forming an n-type amorphous semiconductor layer, an intrinsic amorphous semiconductor layer and a p-type amorphous semiconductor layer, as well as a transparent conductive film.
Figure 6H:
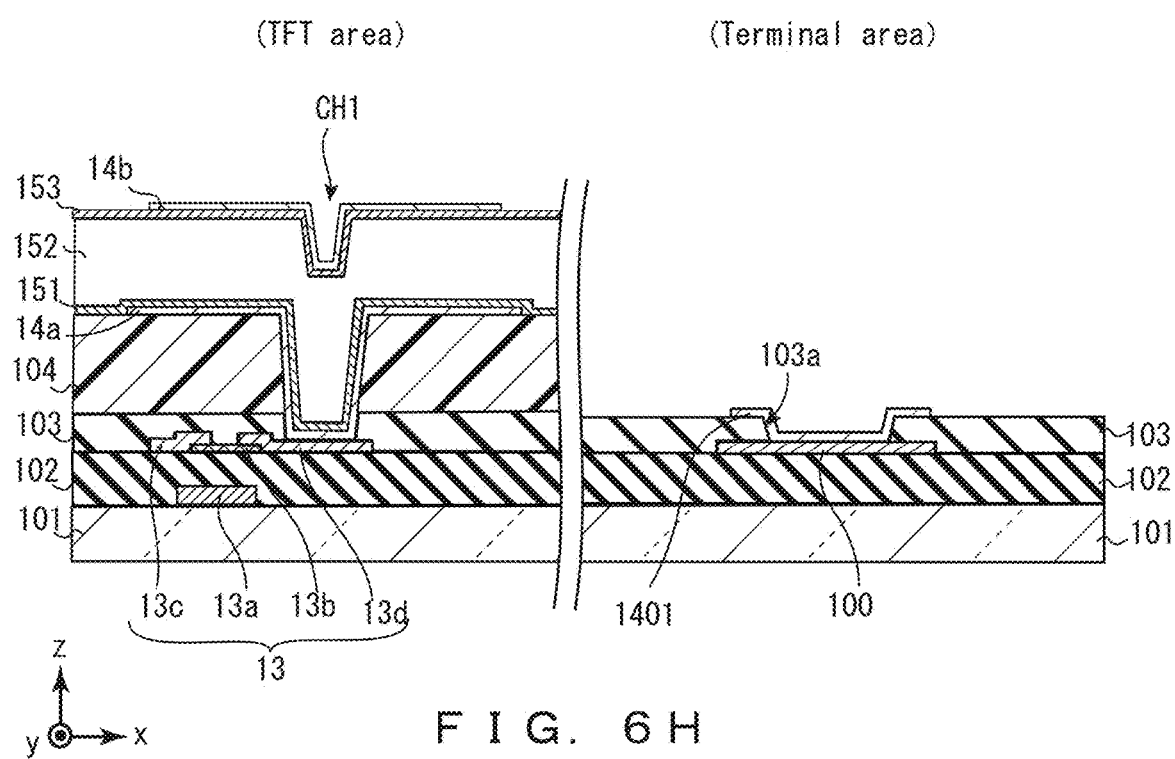
FIG. 6H is a cross-sectional view showing a step of forming an upper electrode in the TFT area shown in FIG. 6G, and removing the semiconductor layers and the transparent conductive film in the terminal area shown therein.
Figure 6I:
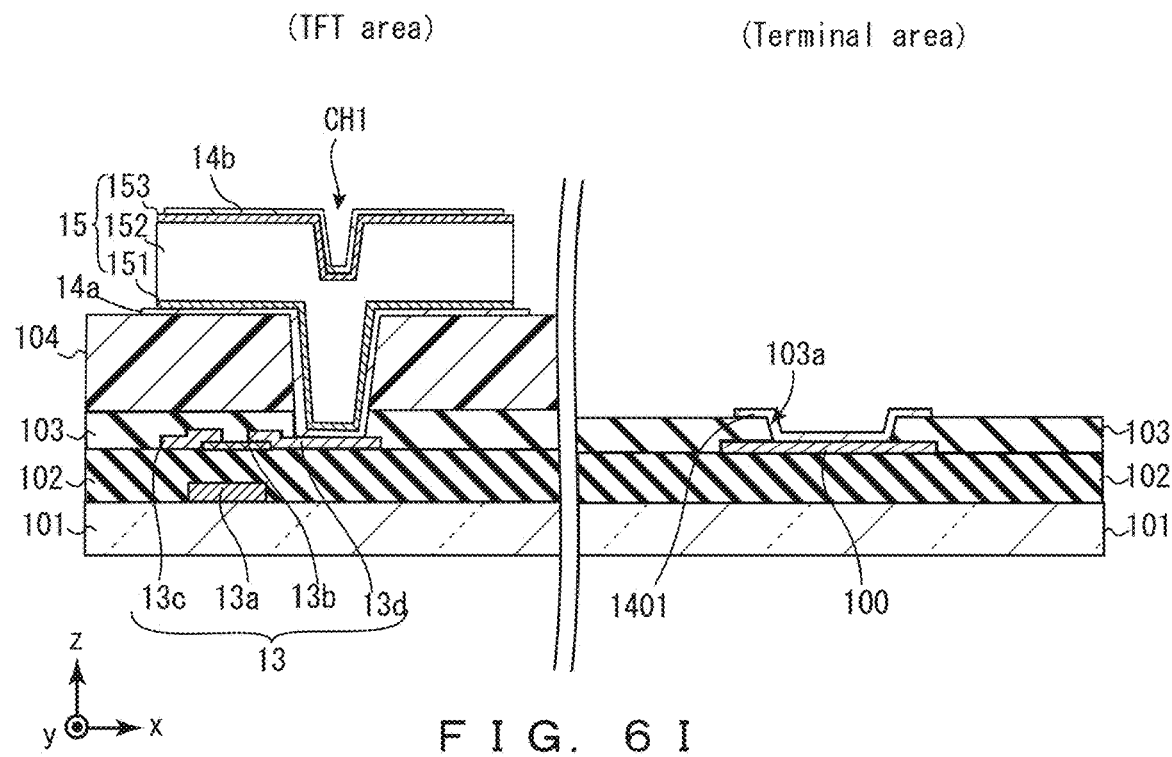
FIG. 6I is a cross-sectional view showing a step of forming a photoelectric conversion layer in the TFT area shown in FIG. 6H.

Then, an opening 104a of the second insulating film 104 is formed by photolithography on the contact hole CH1 in the TFT area, and the second insulating film 104 in the terminal area is removed (see FIG. 6E).

Subsequently, a metal film 140 made of molybdenum nitride (MoN) is formed in the TFT area and the terminal area by, for example, sputtering so as to cover the second insulating film 104 in the TFT area (see FIG. 6F).

Then, photolithography and wet etching are carried out so that the metal film 140 is patterned. Through these steps, on the second insulating film 104 in the TFT area, there is formed the lower electrode 14a that is connected with the drain electrode 13d through the contact hole CH1. Further, on the first insulating film 103 in the terminal area, there is formed the lower electrode layer 1401 that is connected with the source layer 100 through the opening 103a. Here, as the lower electrode layer 1401 is formed in the terminal area, the source layer 100 in the terminal area is not etched by the wet etching carried out when the lower electrode 14a is formed, resulting in that the source layer 100 in the terminal area does not disappear. Subsequently, the n-type amorphous semiconductor layer 151, the intrinsic amorphous semiconductor layer 152, and the p-type amorphous semiconductor layer 153 are formed in the stated order by, for example, plasma CVD, so as to cover the lower electrode 14a and the lower electrode layer 1401. Then, on the p-type amorphous semiconductor layer 153, a transparent conductive film 240 made of, for example, ITO is formed (see FIG. 6G).

Thereafter, photolithography and dry etching are carried out so as to pattern the transparent conductive film 240. Through these steps, the upper electrode 14b is formed on the p-type amorphous semiconductor layer 153 in the TFT area, and the p-type amorphous semiconductor layer 153, the intrinsic amorphous semiconductor layer 152, the n-type amorphous semiconductor layer 153, and the transparent conductive film 240 in the terminal area are removed (see FIG. 6H).

Subsequently, photolithography and dry etching are carried out so that the p-type amorphous semiconductor layer 153, the intrinsic amorphous semiconductor layer 152, and the n-type amorphous semiconductor layer 153 are patterned. Through these steps, in the TFT area, the photoelectric conversion layer 15 having a width in the X-axis direction that is smaller than that of the lower electrode 14a and that is greater than that of the upper electrode 14b is formed (see FIG. 6I).

Figure 6J:
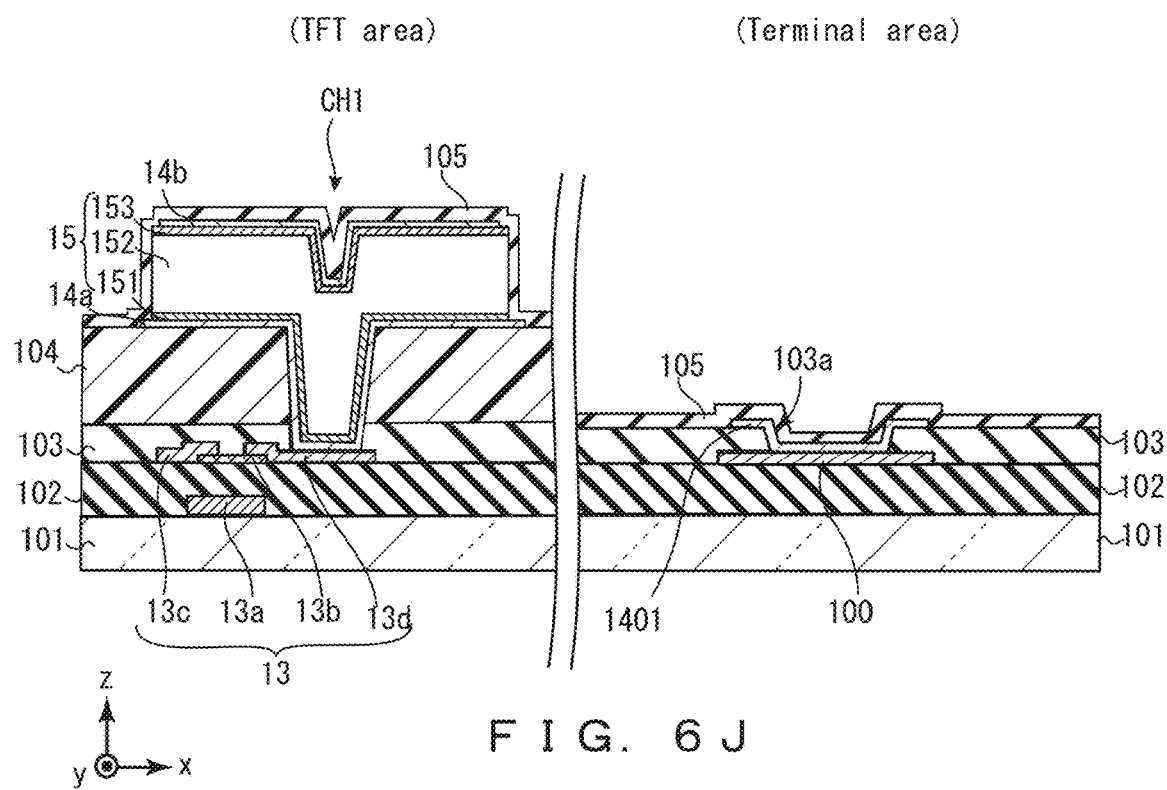
FIG. 6J is a cross-sectional view showing a step of forming a third insulating film in the TFT area and the terminal area shown FIG. 6I.
Figure 6K:
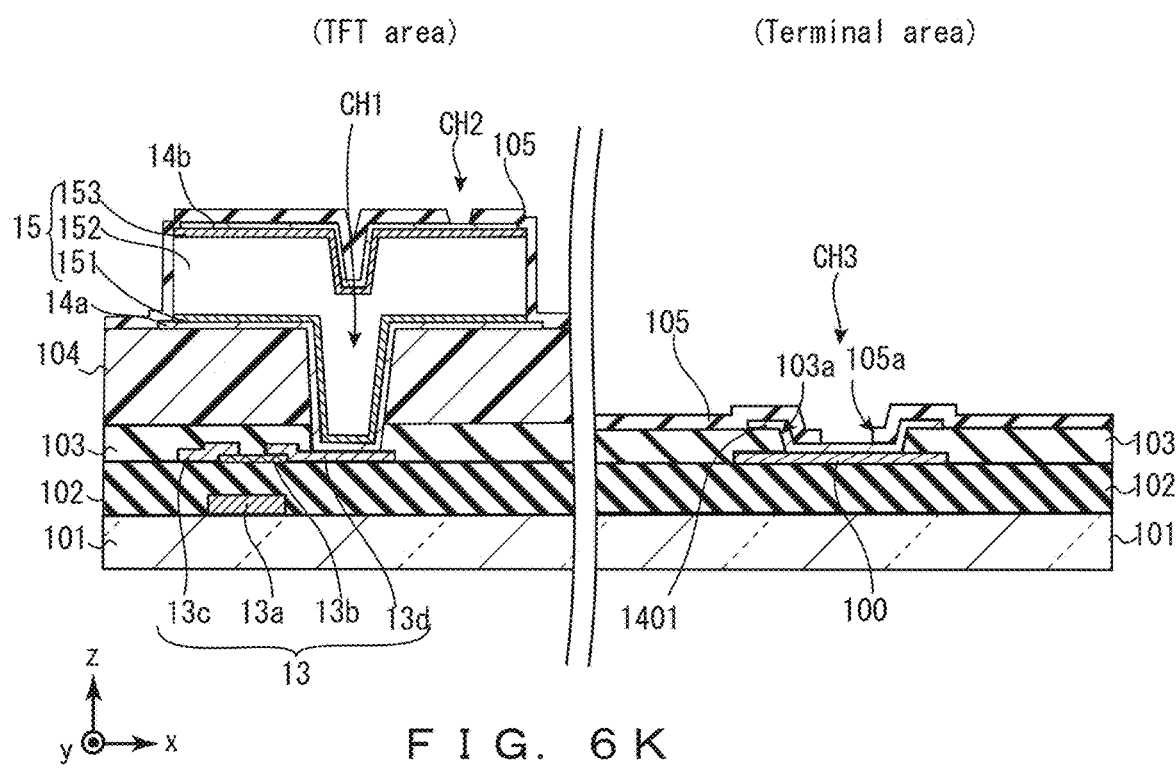
FIG. 6K is a cross-sectional view showing a step of forming a contact hole CH2 in the third insulating film in the TFT area shown in FIG. 6J, and forming an opening 105a in the third insulating film in the terminal area shown therein.
Figure 6L:
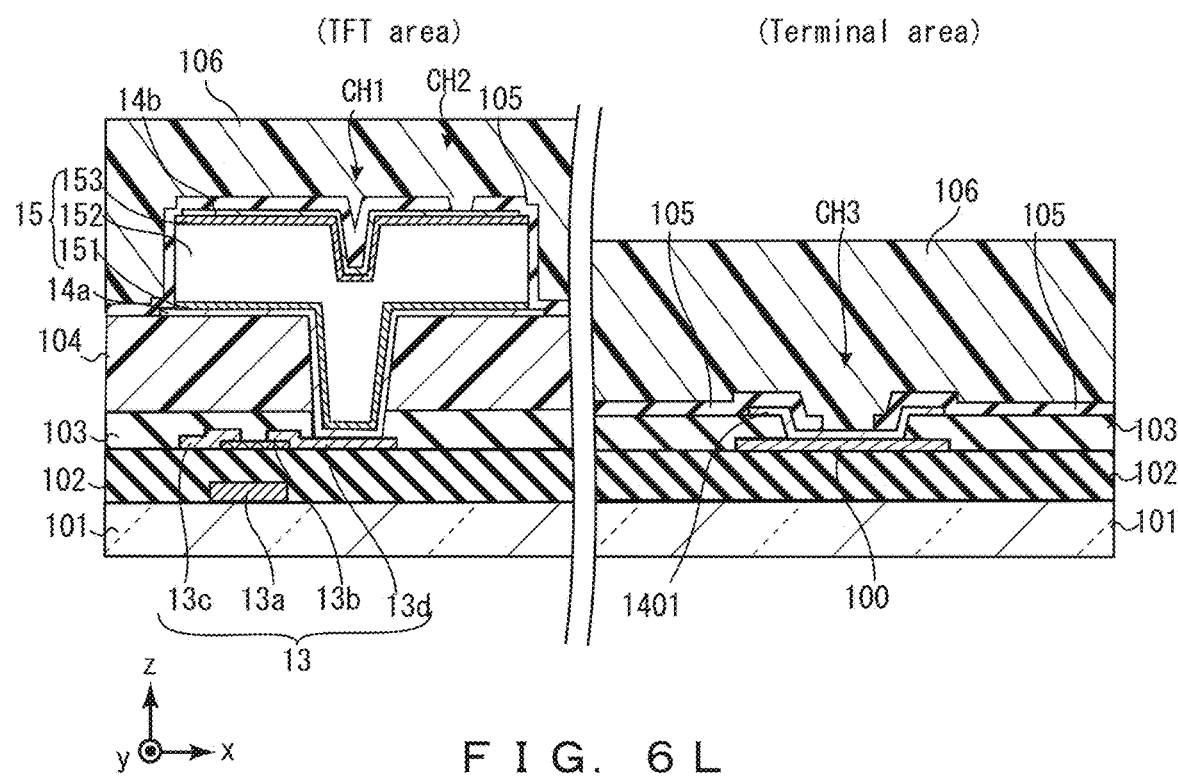
FIG. 6L is a cross-sectional view showing a step of forming a fourth insulating film on the third insulating film shown FIG. 6K.
Figure 6M:
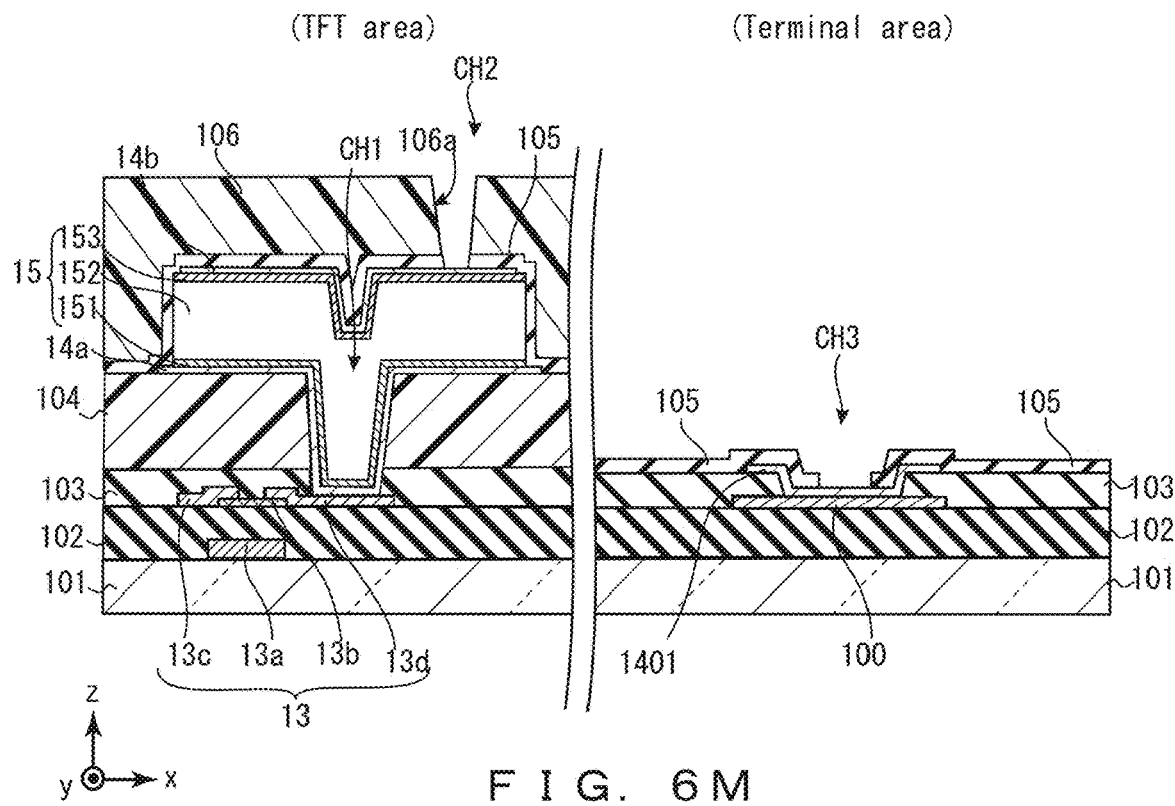
FIG. 6M is a cross-sectional view showing a step of forming an opening in the fourth insulating film in the TFT area shown in FIG. 6L, and removing the fourth insulating film in the terminal area shown therein.

Next, the third insulating film 105 made of silicon nitride (SiN) is formed in the TFT area and the terminal area by, for example, plasma CVD, so as to cover the photoelectric conversion layer 15 (see FIG. 6J).

Thereafter, photolithography and wet etching are carried out so that the third insulating film 105 is patterned. Through these steps, the contact hole CH2 passing through the third insulating film 105 is formed on the upper electrode 14b in the TFT area. Further, an opening 105a in the third insulating film 105 is formed at a position that overlaps with the opening 103a, on the lower electrode layer 1401 in the terminal area. Through these steps, a contact hole CH3 including the opening 103a and the opening 105a is formed in the terminal area (see FIG. 6K).

Subsequently, the fourth insulating film 106 made of acrylic resin or siloxane-based resin is formed so as to cover the third insulating film 105 by, for example, slit coating (see FIG. 6L).

Thereafter, photolithography and wet etching are carried out so that the fourth insulating film 106 is patterned. Through these steps, an opening 106a in the fourth insulating film 106 is formed on the contact hole CH2 in the TFT area, and the fourth insulating film 106 in the terminal area is removed (see FIG. 6M).

Figure 6N:
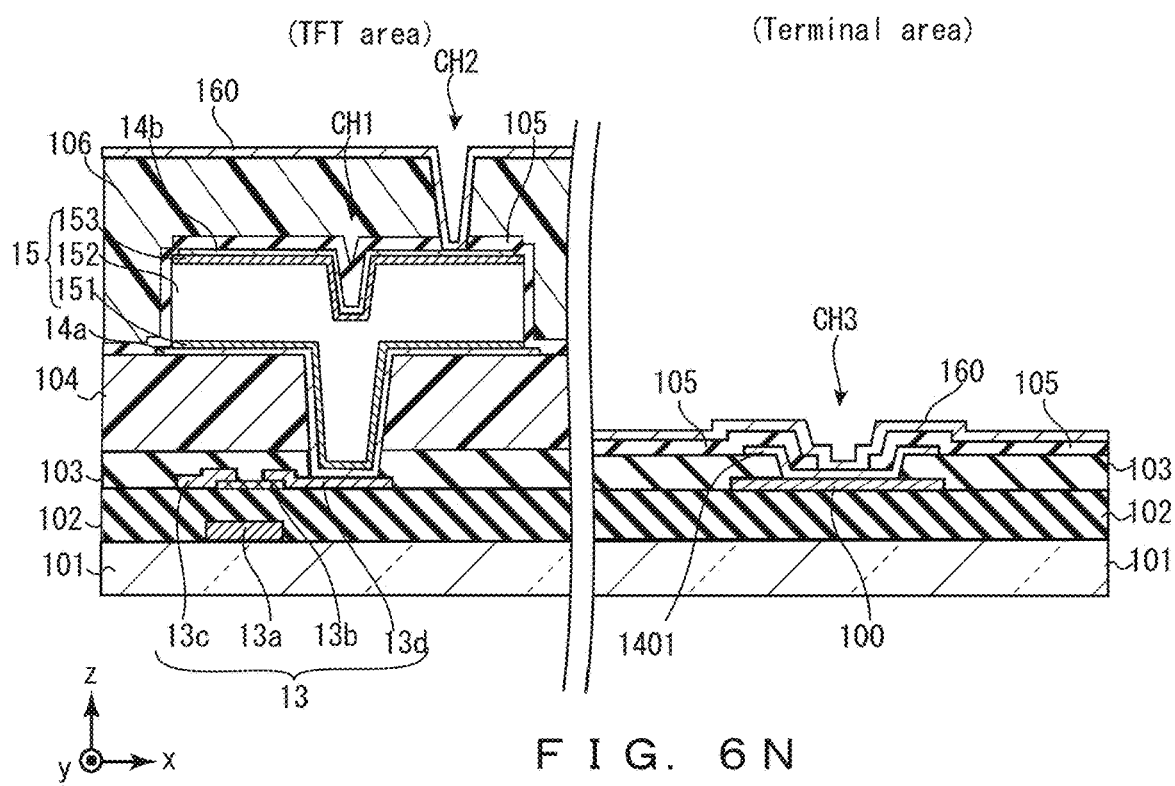
FIG. 6N is a cross-sectional view showing a step of forming a metal film in the TFT area and the terminal area shown in FIG. 6M.
Figure 6O:
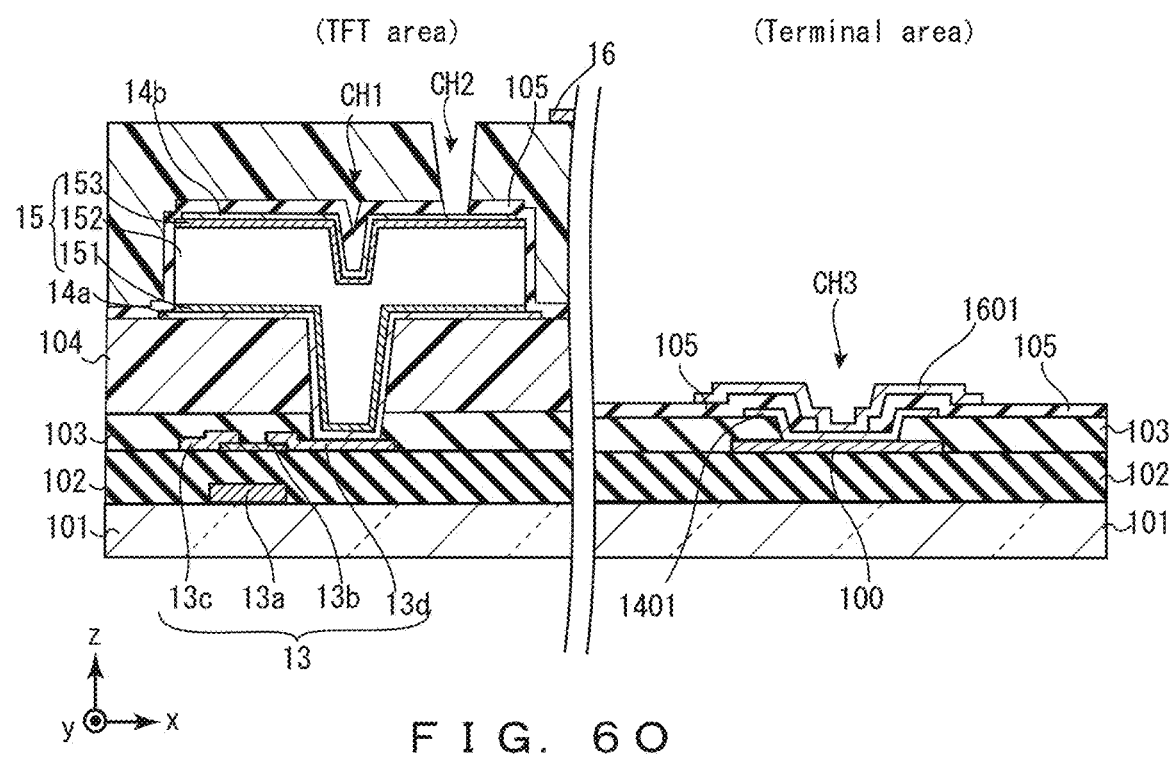
FIG. 6O is a cross-sectional view showing a step of patterning the transparent conductive film shown in FIG. 6N so as to form a bias line in the TFT area, and to form a bias line layer in the terminal area.
Figure 6P:
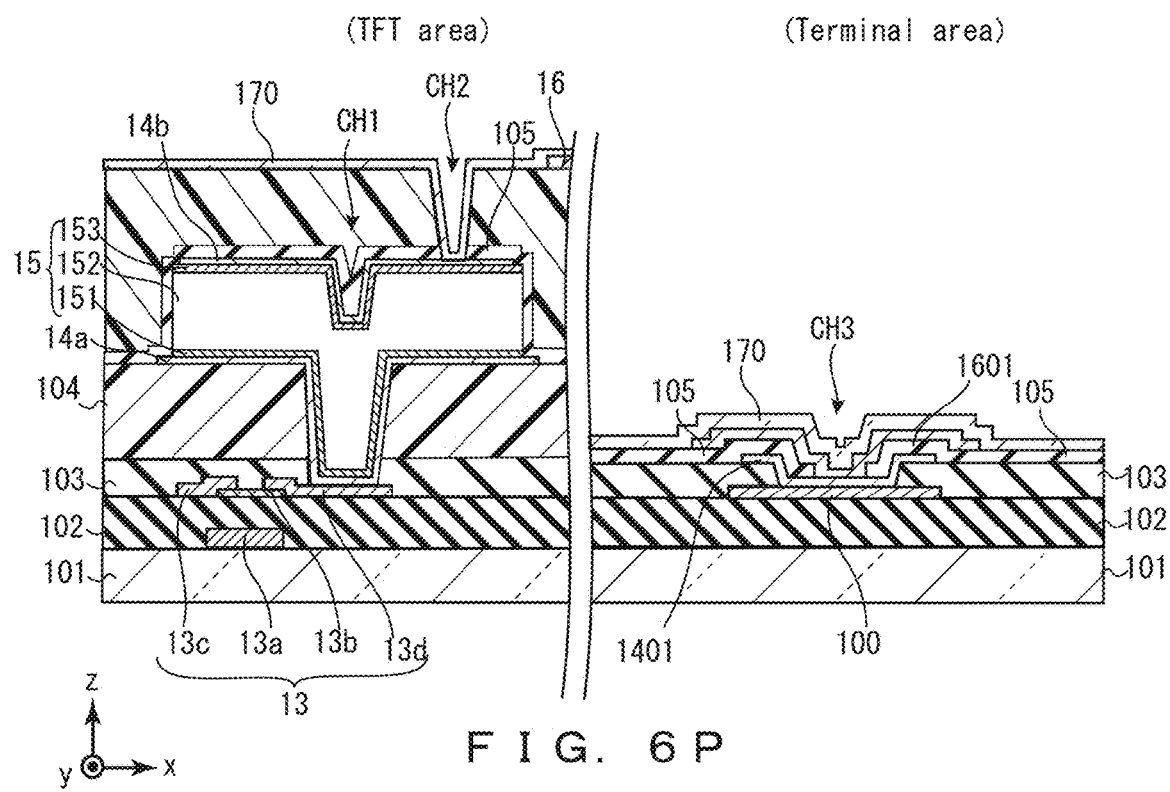
FIG. 6P is a cross-sectional view showing a step of forming a transparent conductive film in the TFT area and the terminal area shown in FIG. 6O.
Figure 6Q:
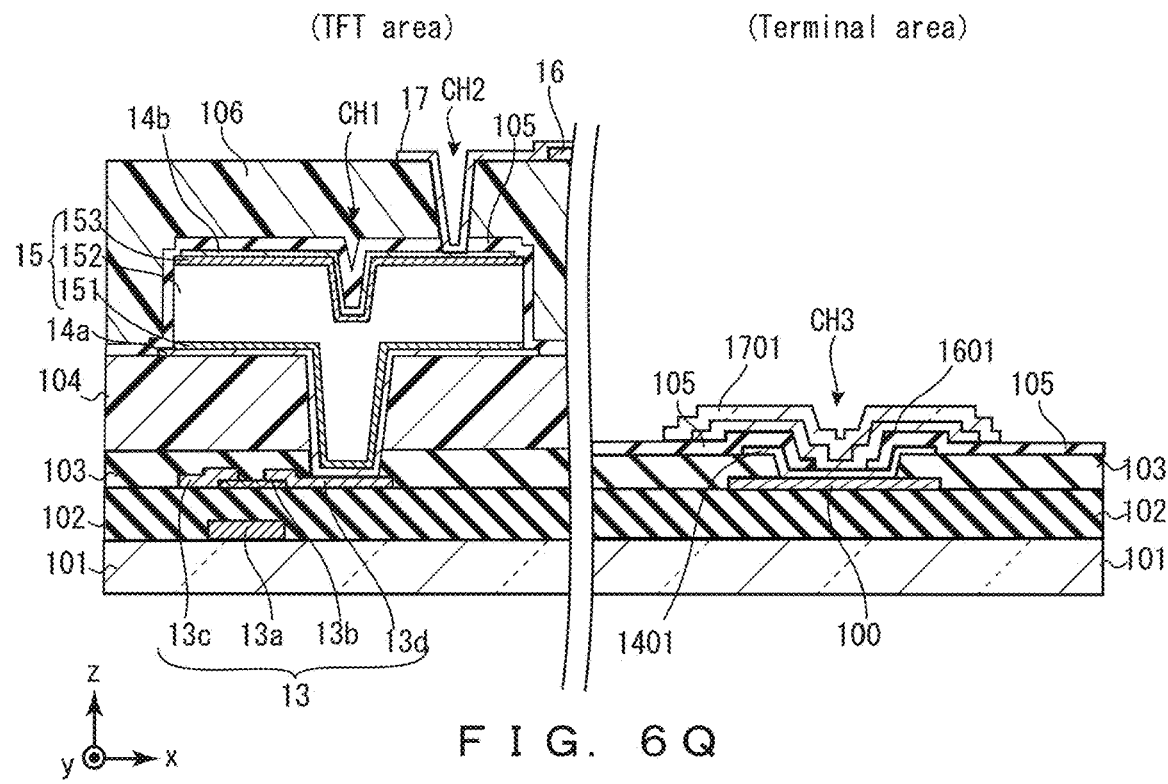
FIG. 6Q is a cross-sectional view showing a step of patterning the transparent conductive film shown in FIG. 6P, forming a conductive film in the TFT area, and forming a transparent conductive film in the terminal area.

Next, a metal film 160 is formed by laminating molybdenum nitride (MoN), aluminum (Al), and titanium (Ti) in this order by, for example, sputtering, so as to cover the fourth insulating film 106 in the TFT area, as well as the third insulating film 105 in the terminal area (see FIG. 6N).

Then, photolithography and wet etching are carried out so that the metal film 160 is patterned. Through these steps, the bias line 16 is formed in the TFT area, and the bias line layer 1601 connected with the lower electrode layer 1401 at the contact hole CH3 is formed in the terminal area (see FIG. 6O). As the bias line layer 1601 connected with the lower electrode layer 1401 is formed in the terminal area, the source layer 100 in the terminal area is covered with the lower electrode layer 1401 and the bias line layer 1601. As a result, the source layer 100 in the terminal area is not etched by wet etching carried out for forming the bias line 16, and therefore, does not disappear.

Subsequently, the transparent conductive film 170 made of ITO is formed by, for example, sputtering so as to cover the fourth insulating film 106 and the bias line 16 in the TFT area, as well as the third insulating film 105 and the bias line layer 1601 in the terminal area (see FIG. 6P).

Then, photolithography and dry etching are carried out so as to pattern the transparent conductive film 170. Through these steps, the transparent conductive film 17 that is connected with the bias line 16 in the TFT area and connected with the upper electrode 14b through the contact hole CH2 is formed. Further, in the terminal area, the transparent conductive film 1701 is formed, which is connected with the bias line layer 1601 at the contact hole CH3 (see FIG. 6Q).

Figure 6R:
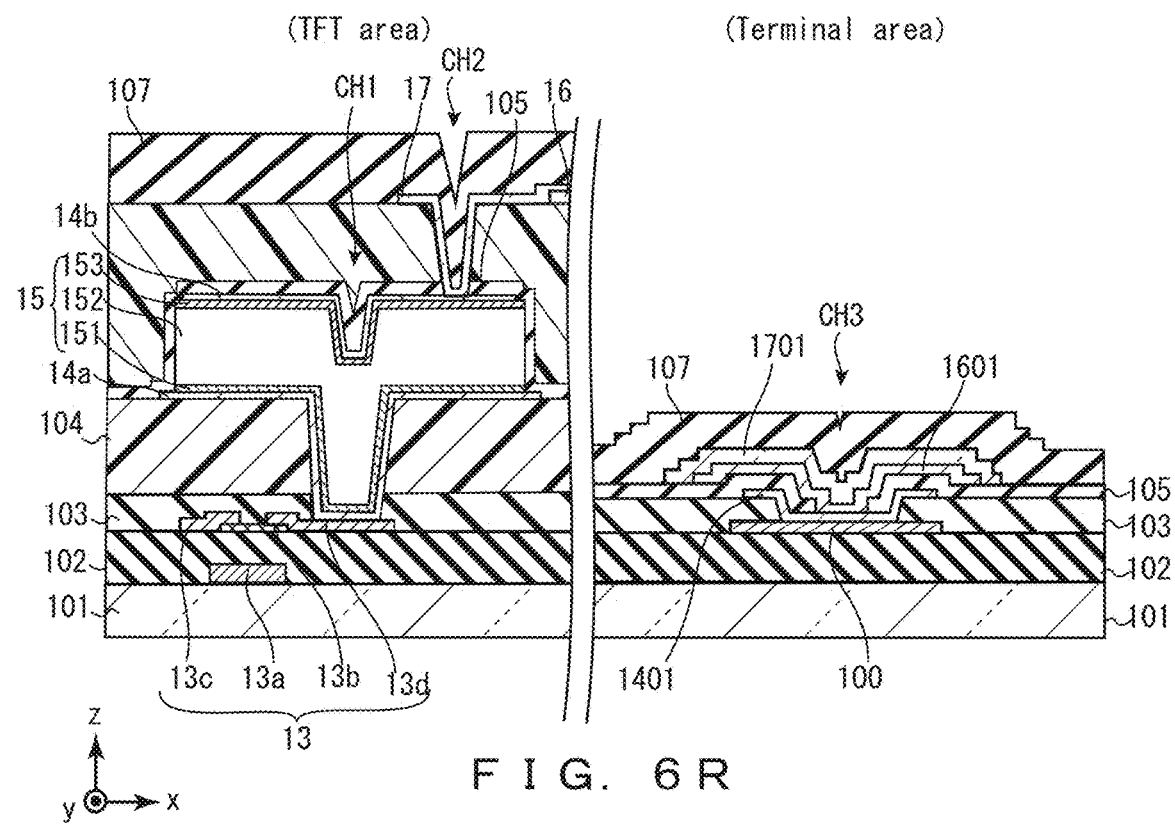
FIG. 6R is a cross-sectional view showing a step of forming a fifth insulating film in the TFT area and the terminal area shown in FIG. 6Q.

Next, the fifth insulating film 107 made of silicon nitride (SiN) is formed by, for example, plasma CVD so as to cover the transparent conductive films 17, 1701 in the TFT area and the terminal area (see FIG. 6R).

Figure 6S:
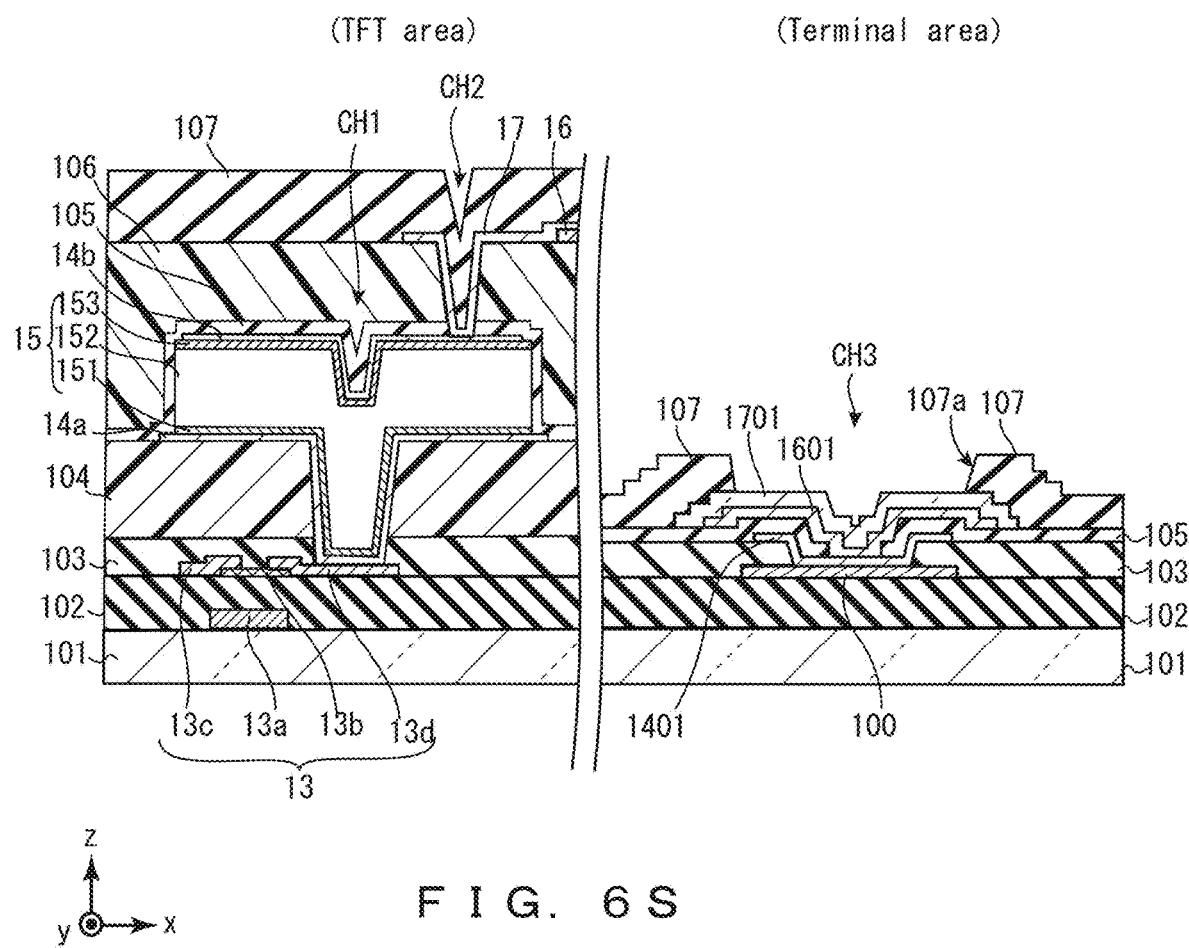
FIG. 6S is a cross-sectional view showing a step of patterning the fifth insulating film shown in FIG. 6R so as to form an opening 107a of the fifth insulating film in the terminal area.
Figure 6U:
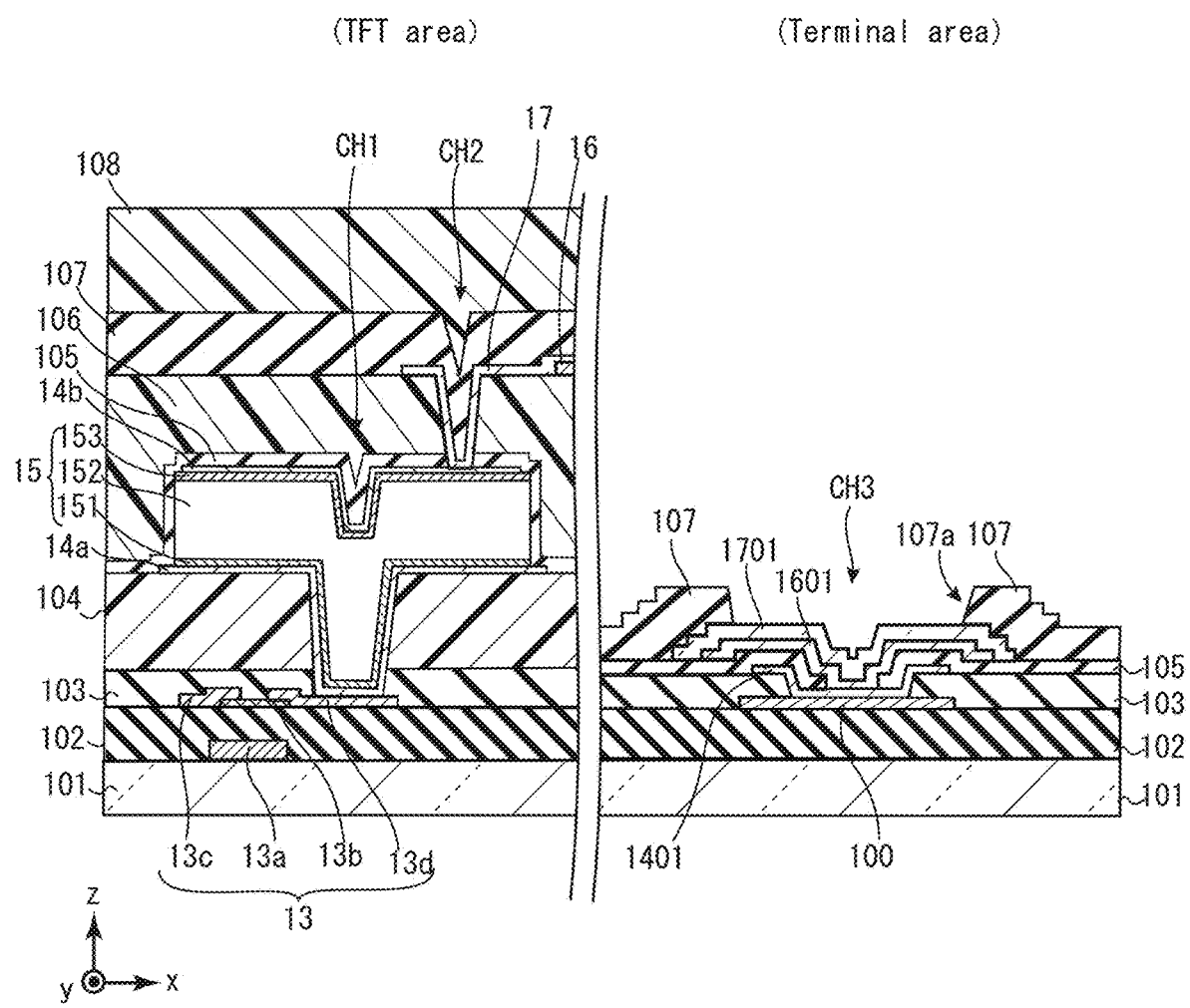
FIG. 6U is a cross-sectional view showing a step of patterning the sixth insulating film shown in FIG. 6T, and removing the sixth insulating film in the terminal area.

Then, photolithography and wet etching are carried out so that the fifth insulating film 107 is patterned. Through these steps, an opening 107a in the fifth insulating film 107 is formed in an area where the contact hole CH3 is provided, on the transparent conductive film 1701 in the terminal area (see FIG. 6S).

Subsequently, the sixth insulating film 108 made of acrylic resin or siloxane-based resin is formed on the fifth insulating film 107 by, for example, slit coating (see FIG. 6T).

Thereafter, photolithography and dry etching are carried out to the sixth insulating film 108 so that parts of the sixth insulating film 108 in the terminal area are removed (see FIG. 6U).

What is described above is the method for producing the imaging panel 1 in Embodiment 1. In the present embodiment, the terminals 31 to 33 have a common structure. In the terminal area where these terminals are formed, in the contact hole CH3 on the source layer 100 that is to become a pad portion, a laminate of the lower electrode layer 1401, the bias line layer 1601, and the transparent conductive film 1701 is arranged a layer covering the pad portion. Since the source layer 100 contains the same material as that of the lower electrode 14a or that of the bias line 16, in a case where the surface of the source layer 100 is not covered with the lower electrode layer 1401 or the bias line layer 1601, the source layer 100 is etched by wet etching carried out when the lower electrode 14a or the bias line 16 is formed. The source layer 100 in the terminal area is covered with the lower electrode layer 1401 and the bias line layer 1601 in Embodiment 1 as mentioned above, and this allows the source layer 100 not to disappear, even if wet etching is carried out when the lower electrode 14a or the bias line 16 is formed. This makes it possible to surely form each terminal in the process for producing the TFT area.

Moreover, each of the terminals 31 to 33 in the present embodiment has such a configuration that the source layer 100, the lower electrode layer 1401, the bias line layer 1601, and the transparent conductive film 1701 are formed so as to be laminated in one contact hole CH3. In other words, in each of these terminals, these layers are connected in one common contact hole. In contrast, for example, in a case where contact holes for achieving the connection between the source layer 100 and the lower electrode layer 1401, the connection between the lower electrode layer 1401 and the bias line layer 1601, and the connection between the bias line layer 1601 and the transparent conductive film 1701 are provided at different positions, respectively, each layer has reconnection. In this case, it is likely that the reconnections of the layers would cause connection defects in the terminals. In the present embodiment, however, since there are not such reconnections of the layers, it is unlikely that connection defects would occur in the terminals.

(Operation of X-Ray Imaging Device 1000)

Here, operations of the X-ray imaging device 1000 shown in FIG. 1 are described. First, X-rays are emitted from the X-ray source 3. Here, the control unit 2 applies a predetermined voltage (bias voltage) to the bias line 16 (see FIG. 3A and the like). X-rays emitted from the X-ray source 3 are transmitted through an object S, and are incident on the scintillator 1A. The X-rays incident on the scintillator 1A are converted into fluorescence (scintillation light), and the scintillation light is incident on the imaging panel 1. When the scintillation light is incident on the photodiode 12 provided in each pixel in the imaging panel 1, the scintillation light is changed to charges by the photodiode 12 in accordance with the amount of the light. A signal according to the charges obtained by converting of the photodiode 12 is read out through the source line 10 to the signal reading unit 2B (see FIG. 2 and the like) when the TFT 13 (see FIG. 3A and the like) is in the ON state according to a gate voltage (positive voltage) that is output from the gate control unit 2A through the gate line 11. Then, an X-ray image in accordance with the signal thus read out is generated in the control unit 2.

Modification Example

The G terminal 31, the S terminal 32, and the B terminal 33 in Embodiment 1 described above are described with reference to an exemplary configuration in which the source layer 100 is provided in the pad portion of the terminal, but the configuration may be such that a gate layer made of the same material as that of the gate electrode 13a is used in place of the source layer 100.

Figure 7:
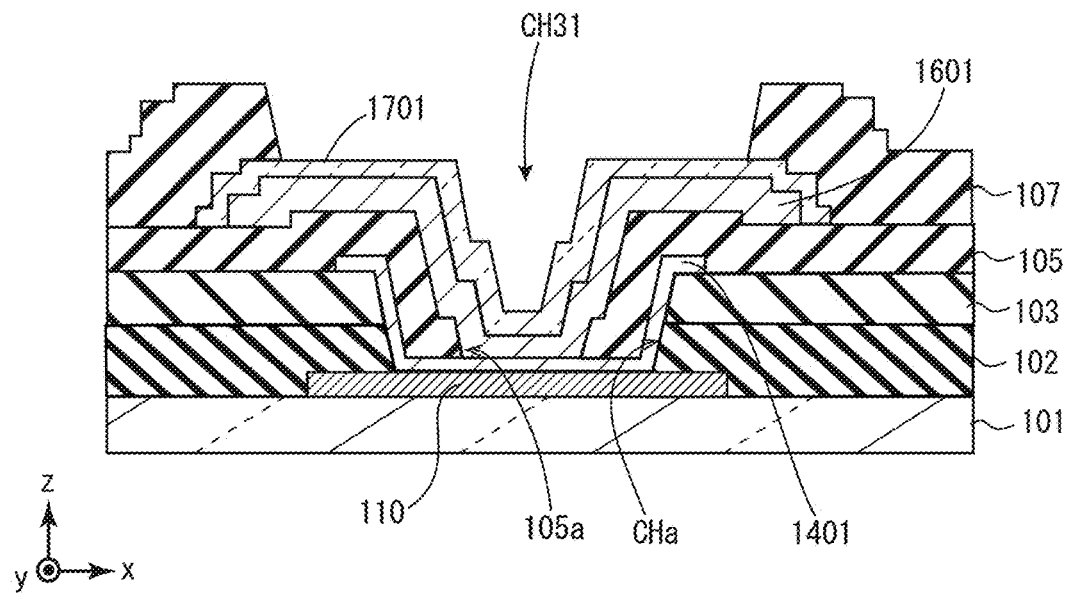
FIG. 7 is a cross-sectional view showing an exemplary structure of a G terminal, an S terminal and a B terminal in a modification example of Embodiment 1.

FIG. 7 is a cross-sectional view showing the structure of the G terminal 311, the S terminal 312, and the B terminal 313 in the present modification example. In FIG. 7, the same constituent members as those in Embodiment 1 are denoted by the same reference symbols as those in Embodiment 1.

As shown in FIG. 7, each of the G terminal 311, the S terminal 312, and the B terminal 313 in the present modification example has such a configuration that a gate layer 110 made of the same material as that of the gate electrode 13a and the gate line 11 is arranged on the substrate 101, and the gate insulating film 102 is arranged on the gate layer 110 so as to have separation. On the gate insulating film 102, the first insulating film 103 is arranged, and an opening CHa that passes through the gate insulating film 102 and the first insulating film 103 is formed therein. The lower electrode layer 1401 is arranged on the first insulating film 103 so as to be in contact with the gate layer 110 through the contact hole CH31. The third insulating film 105 having the opening 105a at a position that overlaps with the opening CHa is arranged on the first insulating film 103 and the lower electrode layer 1401, whereby a contact hole CH31 composed of the openings CHa and 105a is formed. Further, the bias line layer 1601 that is connected with the lower electrode layer 1401 at the contact hole CH31 is arranged on the third insulating film 105. On the third insulating film 105, the transparent conductive film 1701 is arranged so as to cover the bias line layer 1601, and the fifth insulating film 107 is arranged on the transparent conductive film 1701, on an outer side with respect to the contact hole CH31.

In the present modification example, after the gate layer 110 is formed, the gate insulating film 102 is formed so as to cover the gate layer 110, and a metal film that will form the source electrode 13c and the drain electrode 13d is formed on the gate insulating film 102. As to the metal film that will form the source electrode 13c and the drain electrode 13d, parts thereof provided in the terminal area are removed by wet etching carried out when the source electrode 13c and the drain electrode 13d are formed. Here, the wet etching does not cause the gate layer 110 to disappear, because the gate insulating film 102 is provided on the gate layer 110.

Incidentally, in this case, the gate layer 110 and the gate line 11 are formed with the same material, which makes a contact for connecting the G terminal 311 and the gate line 11 unnecessary. On the other hand, the S terminal 312 is connected to an S-G contact that is similar to the S-G contact 40A shown in FIG. 5B, so that the gate layer 110 in the S terminal 312 and the source line 10 are connected. The B terminal 313 is connected to a contact (G-B contact) that connects the gate layer 110 and the bias line 16 with each other.

Figure 8:
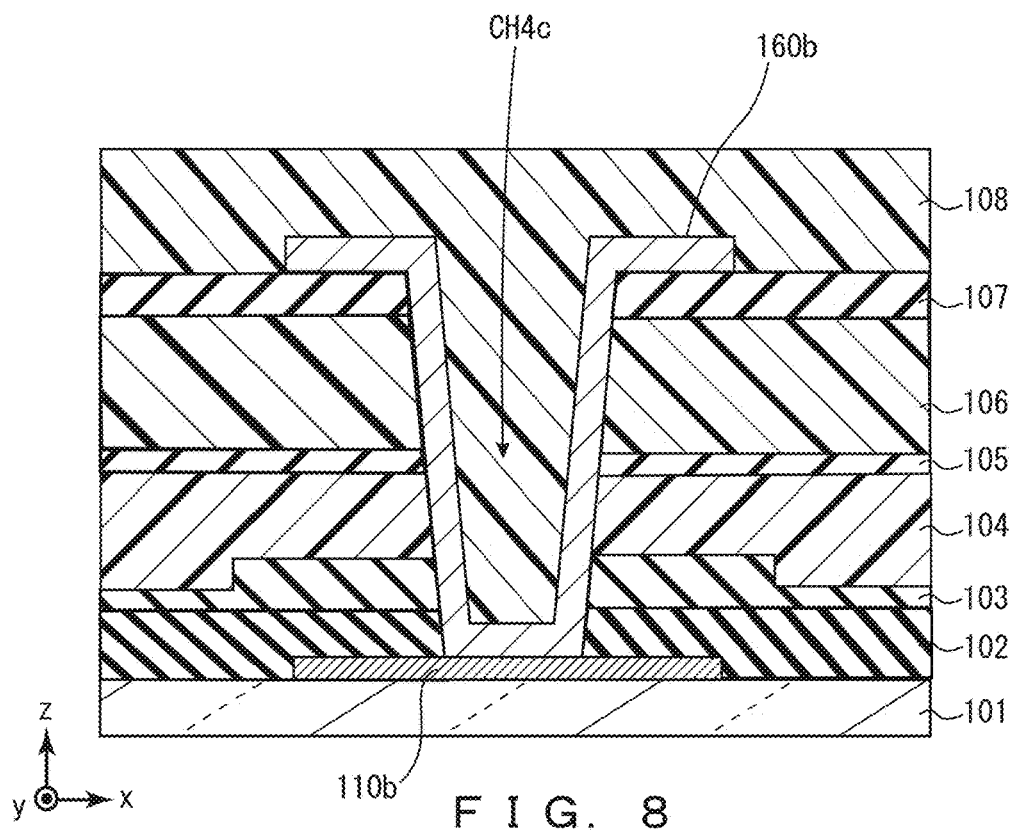
FIG. 8 is a cross-sectional view showing a structure of a contact for connecting the B terminal and the bias line shown in FIG. 7.

FIG. 8 is a cross-sectional view showing a structure of the G-B contact. As shown in FIG. 8, at the G-B contact 40C, the gate layer 110b made of the same material as that of the gate line 11, and the transparent conductive film 160b made of the same material as that of the bias line 16 are connected through a contact hole CH4c. On the gate layer 110b, the following are laminated in the stated order: the gate insulating film 102; the first insulating film 103; the second insulating film 104; the third insulating film 105; the fourth insulating film 106; the fifth insulating film 107; and the sixth insulating film 108. On the gate layer 110b, the contact hole CH4c passes through the gate insulating film 102, the first insulating film 103, the second insulating film 104, the third insulating film 105, the fourth insulating film 106, and the fifth insulating film 107.

In the present modification example, the gate layer 110 in each of the terminals 311 to 313, that is, the pad portion, is covered with a cover layer that includes the lower electrode layer 1401 and the bias line layer 1601. Even if the same material as that of the lower electrode 14a or the bias line 16 is contained in the gate layer 110, it is unlikely that the gate layer 110 would disappear due to wet etching carried out when the lower electrode 14a or the bias line 16 is formed. Besides, as the gate layer 110 is provided in a layer lower than the source layer 100, connection portions of the gate layer 110, the lower electrode layer 1401, the bias line 16, and the transparent conductive film 1701 are provided in a lower layer as compared with Embodiment 1. This enables to make it unlikely that the connection portions would be influenced by scars and the like that occur in the imaging panel production process.

Embodiment 2

The S terminal and the B terminal in the present embodiment have a structure common to the S terminal 32 and the B terminal 33 (see FIG. 5A) in Embodiment 1 described above, and the G terminal has a structure different from those of the S terminal and the B terminal.

Figure 9:
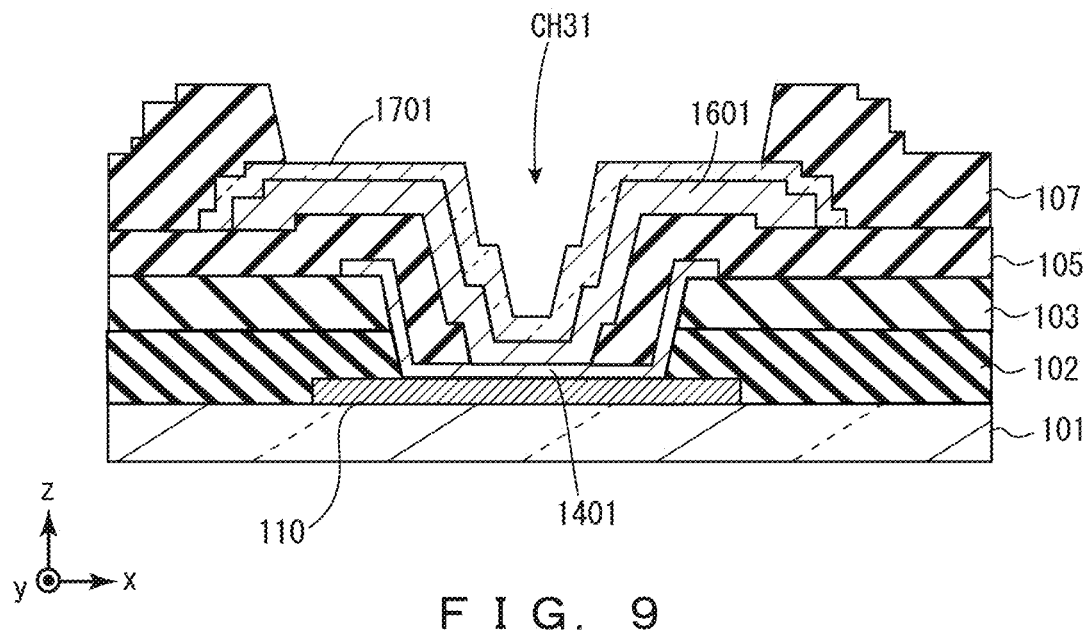
FIG. 9 is a cross-sectional view showing a structure of the G terminal in Embodiment 2.

FIG. 9 is a cross-sectional view of the G terminal in the present embodiment. As shown in FIG. 9, the G terminal 321 in the present embodiment has a terminal structure similar to that in the above-described modification example of Embodiment 1. More specifically, in the G terminal 321, the gate layer 110 is used in the pad portion. In this case, as the gate layer 110 and the gate line 11 are formed with the same material, the G terminal 321 does not need a contact for connection with the gate line 11.

The embodiments of the present invention are thus described above, but the above-described embodiments are merely examples for implementing the present invention. The present invention, therefore, is not limited to the above-described embodiments, and the above-described embodiments can be appropriately varied and implemented without departing from the spirit and scope of the invention. The following description describes modification examples.

(1) The present modification example relates to a cover layer having a structure different from that in the modification example of Embodiment 1 described above (see FIG. 7), and constituent members that are different from those in Modification Example of Embodiment 1 described above are principally described in the following description.

Figure 10:
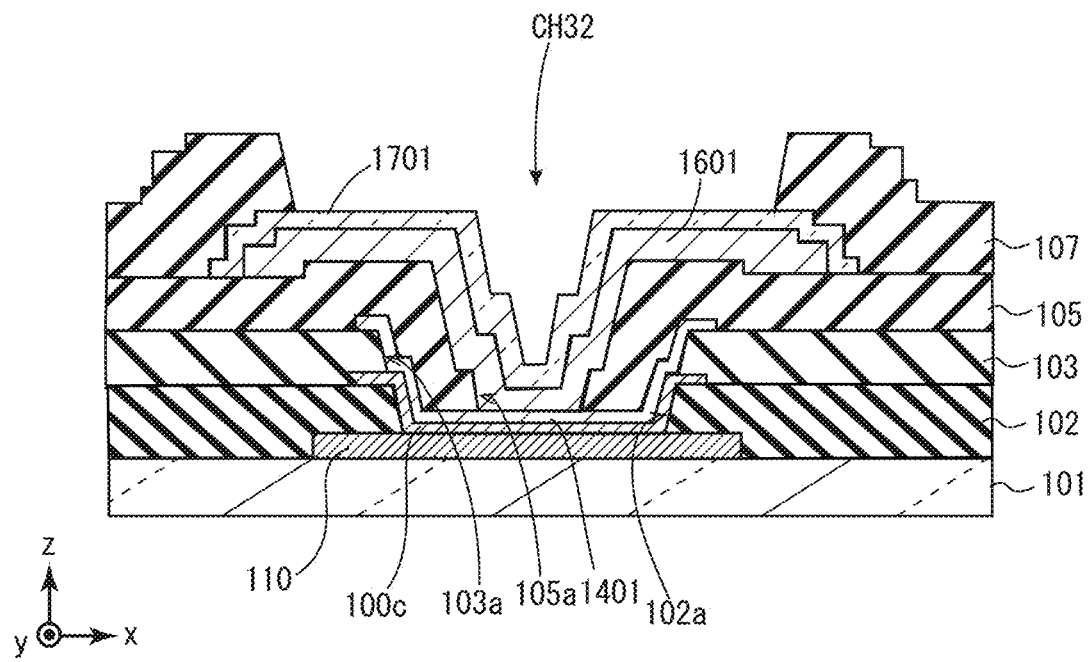
FIG. 10 is a cross-sectional view showing an exemplary structure of a G terminal, an S terminal and a B terminal in Modification Example (1).

FIG. 10 is a cross-sectional view showing an exemplary structure of a G terminal, an S terminal and a B terminal in the present modification example. The G terminal 341, the S terminal 342, and the B terminal 343 in the present modification example further include a source layer 100c made of the same material as that of the source electrode 13c, the drain electrode 13d, and the and source line 10, so that the source layer 110c serves as a cover layer of the gate layer 110 that is to become a pad portion, and further, is interposed between the gate layer 110 and the lower electrode layer 1401. The source layer 100c is formed on the gate insulating film 102, and is connected with the gate layer 110 through the opening 102a provided in the gate insulating film 102. The opening 102a in the gate insulating film 102 is formed by photolithography and dry etching after the gate insulating film 102 is formed.

The first insulating film 103 is provided on the gate insulating film 102 and the source layer 100c, on an outer side with respect to the opening 102a, and has an opening 103a at a position that overlaps with the opening 102a. The lower electrode layer 1401 is provided on the first insulating film 103 so as to be connected with the source layer 100c at the opening 103a. On the first insulating film 103 and the lower electrode layer 1401, the third insulating film 105 having an opening 105a at a position that overlaps with the openings 102a and 103a is arranged. A contact hole CH32 is formed with the openings 102a, 103a, and 105a.

In the present modification example as well, the pad portion formed with the gate layer 110 is covered with the cover layer that includes the source layer 100c, the lower electrode layer 1401, and the bias line layer 1601, and the pad portion is therefore prevented from disappearing due to the etching in the process of forming the active area.

Incidentally, the above-described gate layer 100 has such a structure that molybdenum nitride (MoN) and aluminum (Al) are laminated in the upper layer and the lower layer, respectively, but the structure may be such that tungsten (W) and tantalum nitride (TaN) are laminated in the upper layer and the lower layer, respectively. Further, the above-described source layer 100c has such a structure that molybdenum nitride (MoN), aluminum (Al), and molybdenum nitride (MoN) are laminated in the upper layer, the intermediate layer, and the lower layer, respectively, but the structure may be such that copper (Cu) and titanium (Ti) are laminated in the upper layer and the lower layer, respectively. Still further, the above-described bias line layer 1601 has such a structure that molybdenum nitride (MoN), aluminum (Al), and molybdenum nitride (MoN) are laminated in the upper layer, the intermediate layer, and the lower layer, respectively, but the structure may be such that molybdenum niobium (MoNb), an alloy of aluminum (Al) and neodymium (Nd), and molybdenum niobium (MoNb) are laminated in the upper layer, the intermediate layer, and the lower layer, respectively. In this case, as the etching for the gate layer 100, dry etching with use of a mixture of chlorine-based gas and fluorine-based gas is carried out; and as the etching for the source layer 100c, wet etching with use of acid-mixed liquid, and dry etching with use of a chlorine-based gas is carried out. Further, as the etching for the lower electrode layer 1401 and the bias line layer 1601, wet etching with use of acid-mixed liquid similar to that for the source layer is carried out.

(2) The present modification example is described with reference to an example in which the G terminal, the S terminal, and the B terminal are formed by a method different from that used in Modification Example of Embodiment 1 described above (see FIG. 7). The following description principally describes configurations different from those in Modification Example of Embodiment 1 described above.

In Modification Example of Embodiment 1 described above, the gate layer 110 shown in FIG. 7 has such a structure that molybdenum nitride (MoN) and aluminum (Al) are laminated; in the present modification example, titanium (Ti) is used in place of molybdenum nitride (MoN) in the upper layer. Further, in the step in which the gate insulating film 102 is formed after the gate layer 110 is formed, and thereafter the source electrode 13c and the drain electrode 13d are formed (see FIG. 6C), wet etching is carried out with etching liquid in which acetic acid, nitric acid, and phosphoric acid are used. As the etch selectivity of titanium (Ti) with respect to molybdenum nitride (MoN) and aluminum (Al) used in the source electrode 13c and the drain electrode 13d is high, wet etching does not cause the gate layer 110 to disappear.

Incidentally, in a case where the same gate layer 110 as that in in Modification Example of Embodiment 1 described above is used, molybdenum nitride (MoN), aluminum (Al), and titanium (Ti) may be laminated in the upper layer, the intermediate layer, and the lower layer, respectively, and wet etching and dry etching may be carried out for forming the source electrode 13c and the drain electrode 13d, so that the gate layer 110 would not disappear. In this case, the film of titanium (Ti) provided in a lower layer preferably has a thickness of 80 nm or less.

In other words, when the source electrode 13c and the drain electrode 13d are formed, the films of molybdenum nitride (MoN) and aluminum (Al) provided in the upper layer and the intermediate layer, respectively, are wet-etched with etching liquid with use of, for example, acetic acid, nitric acid, and phosphoric acid. Thereafter, titanium (Ti) formed in the lower layer is dry-etched with use of, for example, chlorine-based gas. In dry etching, the etch selectivity of molybdenum nitride (MoN) in the upper layer of the gate layer 110 with respect to titanium (Ti) is high. Further, the film of titanium (Ti) in the lower layer, used in the source electrode 13c and the drain electrode 13d, is thin and the etching time for this film is short. Dry etching therefore does not cause the pad portion formed with the gate layer 110 to disappear.

(3) Modification Example of Embodiment 1 described above (see FIG. 7) is described with reference to an exemplary configuration in which the lower electrode layer is included in the cover layer in each of the G terminal, the S terminal, and the B terminal. The present modification example is described with reference to an exemplary configuration in which a source layer made the same material as that of the source electrode 13c, the drain electrode 13d, and the source line 10 is provided in place of the lower electrode layer. The following description principally describes configurations different from those in Modification Example of Embodiment 1 described above.

Figure 11:
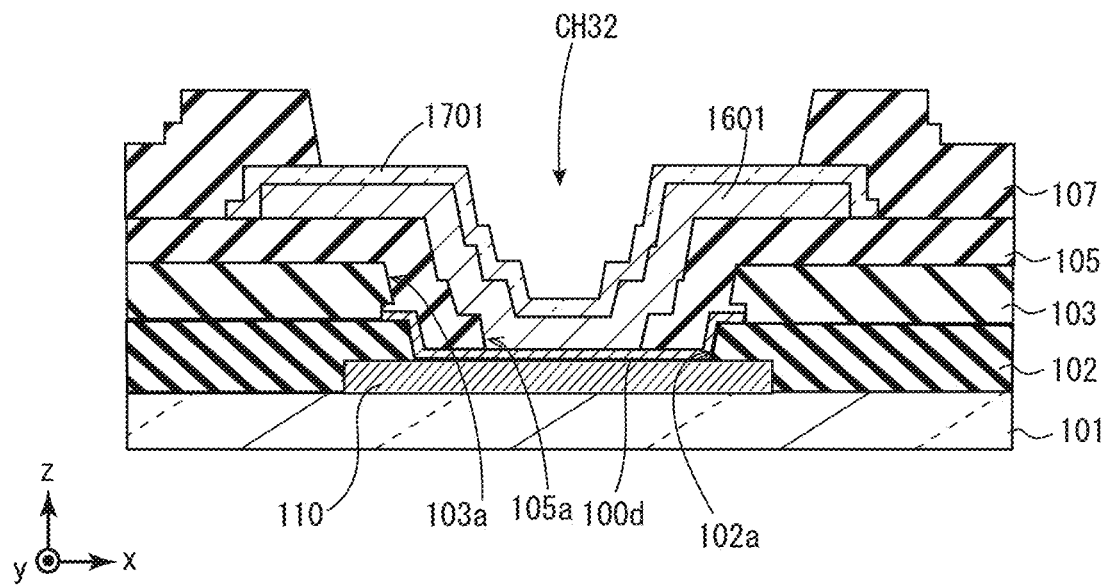
FIG. 11 is a cross-sectional view showing an exemplary structure of a G terminal, an S terminal and a B terminal in Modification Example (3).

FIG. 11 is a cross-sectional view showing an exemplary structure of a G terminal, an S terminal and a B terminal in the present modification example. The G terminal 351, the S terminal 352, and the B terminal 353 in the present modification example have a configuration in which a source layer 100d connected with the gate layer 110 via the opening 102a of the gate insulating film 102 is provided on the gate layer 110 that is to become a pad portion.

Each of the source electrode 13c, the drain electrode 13d, and the source line 10 has a laminate structure obtained by laminating molybdenum nitride (MoN) in the upper layer, aluminum (Al) in the intermediate layer, and titanium (Ti) in the lower layer.

The source layer 100d is formed with titanium (Ti) in the lower layer, as the wet etching carried out when the lower electrode 14a is formed causes molybdenum nitride (MoN) in the upper layer and aluminum (Al) in the intermediate layer to disappear.

In other words, after the source layer 100d formed with molybdenum nitride (MoN) in the upper layer, aluminum (Al) in the intermediate layer, and titanium (Ti) in the lower layer is formed on the gate insulating film 102, the first insulating film 103 having the opening 103a at a position that overlaps with the opening 102a is formed on the source layer 100d. Thereafter, a metal film 140 (see FIG. 6F) that is to become the lower electrode 14 is formed on the first insulating film 103, and the metal film 140 in the terminal area is wet-etched with etching liquid with use of, for example acetic acid, nitric acid, and phosphoric acid. Here, molybdenum nitride (MoN) in the upper layer and aluminum (Al) in the intermediate layer in the source layer 100d disappear. On the other hand, titanium (Ti) in the lower layer remains, since the etch selectivity of titanium with respect to molybdenum nitride (MoN) and aluminum (Al) is high. The pad portion formed with the gate layer 110 therefore does not disappear, either.

Further, this wet etching causes an end portion of the first insulating film 103 on the opening 103a side is side-etched, whereby the end portion of the first insulating film 103 on the opening 103a side overhangs.

The third insulating film 105 has an opening 105a inside the opening 103a of the first insulating film 103. In a case where the opening 105a of the third insulating film 105 is formed on an outer side with respect to the opening 103a of the first insulating film 103, disconnection between the bias line layer 1601 and the transparent conductive film 1701 tends to occur at the overhanging part. The above-described configuration, therefore, makes it possible to prevent disconnection between the bias line layer 1601 and the transparent conductive film 1701.

Incidentally, the third insulating film 105 preferably has a thickness greater than the sum of the thicknesses of the upper layer and the intermediate layer that disappear in the source layer 100d. This configuration makes it possible to prevent disconnection between the bias line layer 1601 and the transparent conductive film 1701. Further, the films of molybdenum nitride (MoN), aluminum (Al), and molybdenum nitride (MoN) that form the bias line layer 1601 preferably have a thickness greater than the sum of the thicknesses of the films of molybdenum nitride (MoN) and aluminum (Al) of the source layer 100d before the etching. This configuration makes it possible to prevent disconnection between the bias line layer 1601 and the transparent conductive film 1701 more surely.

This example is described with an exemplary configuration in which titanium (Ti) is contained in the source electrode 13c, the drain electrode 13d, the source line 10, and the source layer 100d, but the configuration may be such that an alloy containing tantalum (Ta), tungsten (W), and titanium (Ti), an alloy containing tantalum (Ta), or an alloy containing tungsten (W) may be contained in place of titanium (Ti).

(4) In Modification Example (3) described above, the source electrode 13c, the drain electrode 13d, and the source line 10 have a laminate structure obtained by laminating molybdenum nitride (MoN) in the upper layer, aluminum (Al) in the intermediate layer, and titanium (Ti) in the lower layer; on the other hand, the present modification example is described with reference to an exemplary configuration in which titanium (Ti) is laminated in the upper layer.

Figure 12:
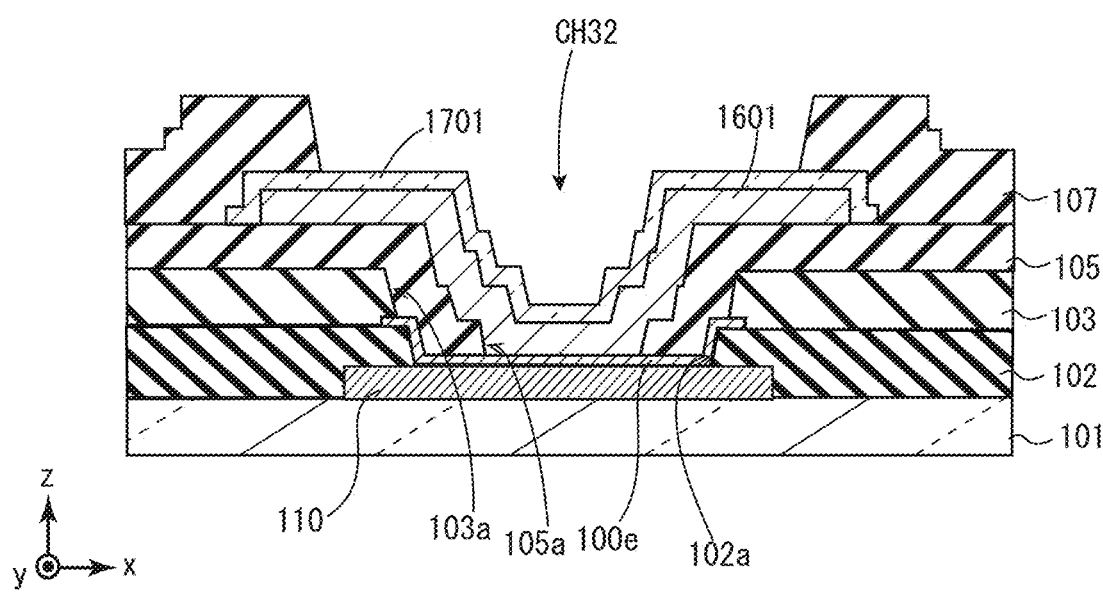
FIG. 12 is a cross-sectional view showing an exemplary structure of a G terminal, an S terminal and a B terminal in Modification Example (4).

FIG. 12 is a cross-sectional view showing an exemplary structure of the G terminal, the S terminal, and the B terminal in the present modification example. The G terminal 361, the S terminal 362, and the B terminal 363 in the present modification example have a configuration in which a source layer 100e connected with the gate layer 110 via the opening 102a in the gate insulating film 102 is provided on the gate layer 110. The source layer 100e has a laminate structure obtained by laminating titanium (Ti) in the upper layer, aluminum (Al) in the intermediate layer, and titanium (Ti) in the lower layer.

In this case, after the source layer 100e is formed, the first insulating film 103 having the opening 103a at a position that overlaps with the opening 102a is formed on the source layer 100e. Thereafter, a metal film 140 (see FIG. 6F) that is to become the lower electrode 14a is formed on the first insulating film 103, and the metal film 140 in the terminal area is wet-etched. The metal film 140 is formed with molybdenum nitride (MoN), and is etched with etching liquid with use of, for example acetic acid, nitric acid, and phosphoric acid. As the etch selectivity of titanium (i) in the upper layer of the source layer 100e with respect to molybdenum nitride is high in wet etching, the source layer 100e does not disappear, and the pad portion formed with the gate layer 110 does not disappear, either.

This example is described with an exemplary configuration in which titanium (Ti) is contained in the source electrode 13c, the drain electrode 13d, the source line 10, and the source layer 100e, but the configuration may be such that an alloy containing tantalum (Ta), tungsten (W), and titanium (Ti), an alloy containing tantalum (Ta), or an alloy containing tungsten (W) may be contained in place of titanium (Ti).

Further, the metal film 140 that is to become the lower electrode 14a may have such a configuration that molybdenum nitride (MoN) is laminated in the upper layer and titanium (Ti) is laminated in the lower layer, while molybdenum nitride (MoN) is used in place of titanium (Ti) in the upper layer and the lower layer of the source layer 100e. The lower layer of the metal film 140 preferably has a thickness of 80 nm or less.

In this case, molybdenum nitride (MoN) in the upper layer of the metal film 140 is wet-etched with an etching liquid with use of, for example, acetic acid, nitric acid, and phosphoric acid, and thereafter, dry etching with use of, for example, chlorine-based gas is carried out, whereby titanium (Ti) in the lower layer in the metal film 140 is removed. In dry etching, the etch selectivity of molybdenum nitride (MoN) in the upper layer of the source 100e with respect to titanium (Ti) is high. Further, the film of titanium (Ti) in the lower layer in the metal film 140 is thin, and etching of the same requires only short time. The etching of the metal film 140, therefore, does not cause the source layer 100e to disappear, thereby not causing the pad portion formed with the gate layer 110 to disappear.

(5) Modification Example of Embodiment 1 described above (see FIG. 7) is described with reference to an exemplary configuration in which the bias line layer is included as a cover layer that covers the pad portion formed with the gate layer 110, in the G terminal, the S terminal, and the B terminal. The present modification example is described with reference to an exemplary configuration in which the source layer made of the same material as that of the source electrode 13c, the drain electrode 13d, and the source line 10 is included in the cover layer, in place of the bias line layer. The following description principally describes configurations different from those in Modification Example of Embodiment 1 described above.

FIG. 13 is a cross-sectional view showing an exemplary structure of the G terminal, the S terminal, and the B terminal in the present modification example. Each of the G terminal 371, the S terminal 372, and the B terminal 373 in the present modification example has a configuration in which a source layer 100f connected with the gate layer 110 via the opening 102a in the gate insulating film 102 is provided on the gate layer 110.

The materials used for forming the source electrode 13c, the drain electrode 13d, and the source line 10 are identical to those in Modification Example of Embodiment 1, and the source layer 100f has a laminate structure obtained by laminating molybdenum nitride (MoN) in the upper layer, aluminum (Al) in the intermediate layer, and molybdenum nitride (MoN) in the lower layer.

The first insulating film 103 having the opening 103a at a position that overlaps with the opening 102a is provided on the source layer 100f. On the first insulating film 103, a lower electrode layer 1401f connected with the source layer 100f at the opening 103a is provided. The lower electrode layer 1401f is formed with the same material as that for the lower electrode 14a, and in the present modification example, the lower electrode layer 1401f is made of titanium (Ti).

On the lower electrode layer 1401f, the third insulating film 105 having an opening 105a inside the opening 103a. The openings 102a, 103a, and 105a are formed so as to overlap with one another when viewed in a plan view. On the third insulating film 105, the transparent conductive film 1701 connected with the source layer 100f through the opening 105a is arranged, and the fifth insulating film 107 is provided on an outer side with respect to the contact hole CH35 on the transparent conductive film 1701.

In this case, when the lower electrode 14a is formed, in the step shown in FIG. 6F, the metal film 140 that is to become the lower electrode 14a is dry-etched with chlorine-based gas, whereby the lower electrode 14a is formed in the TFT area and the lower electrode layer 1401f is formed in the terminal area.

Thereafter, through the steps shown in FIGS. 6K to 6M, the fifth insulating film 107 having the opening 105a is formed on the lower electrode layer 1401f. Then, the same step as that shown in FIG. 6N is carried out so that the transparent conductive film 160 that is to become the bias line 16 is formed, and the transparent conductive film 160 is wet-etched with etching liquid with use of, for example, acetic acid, nitric acid, and phosphoric acid. Through these steps, the bias line 16 is formed in the TFT area, and the transparent conductive film 160 in the terminal area is removed. Here, as the etch selectivity of titanium (Ti) in the lower electrode layer 1401f with respect to molybdenum nitride (MoN) in the conductive film 160 is high in wet etching, the lower electrode layer 1401f does not disappear. In other words, the etching carried out when the active area is formed does not cause the cover layer to disappear, and does not cause the pad portion formed with the gate layer 110 to disappear, either.

This example is described with reference to an exemplary configuration in which titanium (Ti) is contained in the lower electrode 14a and the lower electrode layer 1401f, but the configuration may be such that an alloy containing tantalum (Ta), tungsten (W), and titanium (Ti), an alloy containing tantalum (Ta), or an alloy containing tungsten (W) may be contained in place of titanium (Ti).

Further, in the above-described example, molybdenum nitride (MoN) may be used in place of titanium (Ti), to form the metal film 140 that is to become the lower electrode 14a and the lower electrode layer 1401f. Further, molybdenum nitride (MoN), aluminum (Al), and titanium (Ti) may be laminated in the upper layer, the intermediate layer, and the lower layer, respectively, for forming the transparent conductive film 160 that is to become the bias line 16. The lower layer in the transparent conductive film 160 preferably has a thickness of 80 nm or less.

In this case, when the metal film 140 that is to become the lower electrode 14a is wet-etched and the bias line 16 is formed, etching is carried out with etching liquid with use of, for example, acetic acid, nitric acid, and phosphoric acid. Through these steps, molybdenum nitride (MoN) and aluminum (Al) in the upper and intermedium layers, respectively, in the transparent conductive film 160 are removed. Thereafter, dry etching with use of chlorine-based gas is carried out, whereby titanium (Ti) in the lower layer is removed. The etch selectivity of molybdenum nitride (MoN) in the upper layer in the lower electrode layer 1401f with respect to titanium (Ti) is high in dry etching. Further, the film of titanium (Ti) in the lower layer in the transparent conductive film 160 is thin, and etching of the same requires only short time. The etching carried out for forming the bias line 16, therefore, does not cause the lower electrode layer 1401f to disappear. The etching carried out for forming the active area, therefore, does not cause the cover layer to disappear, and does not cause the pad portion formed with the gate layer 110 to disappear, either.

(6) The above-described embodiments and modification examples are described with reference to an exemplary configuration in which two or more layers are provided in the cover layer, but at least one layer may be provided in the cover layer. The following description will describe the exemplary configuration.

Figure 14:
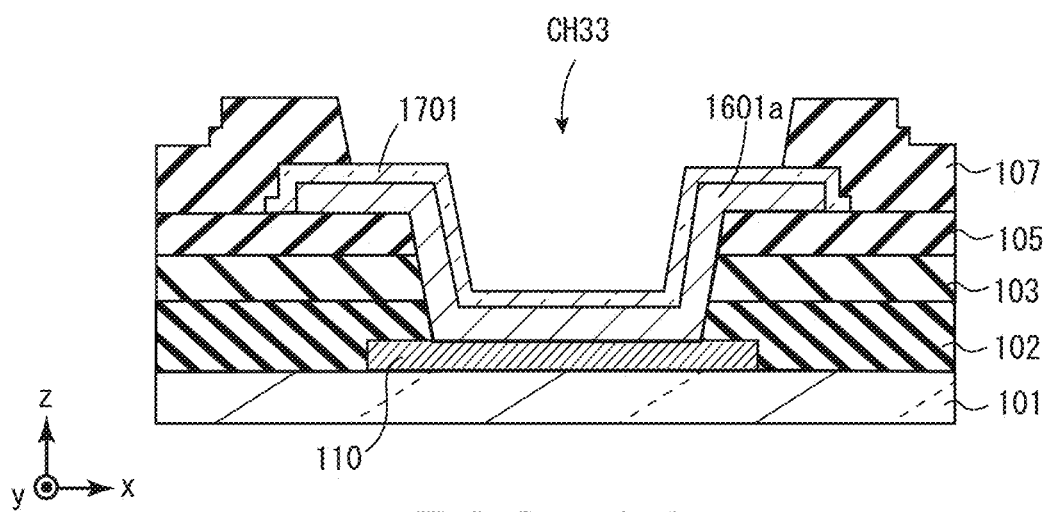
FIG. 14 is a cross-sectional view showing an exemplary structure of a G terminal, an S terminal and a B terminal in Modification Example (6).

FIG. 14 is a cross-sectional view showing an exemplary structure of a G terminal, an S terminal and a B terminal in the present modification example. In FIG. 14, the same constituent members as those in Embodiment 1 are denoted by the same reference symbols as those in Embodiment 1. In the G terminal 381, the S terminal 382, and the B terminal 383 shown in FIG. 14, a bias line layer 1601a is provided as a cover layer on the gate layer 110 that is the pad portion; and the gate layer 110, the bias line layer 1601a, and the transparent conductive film 1701 are connected in the contact hole CH33.

The gate layer 110 is formed with the same material as that of the gate electrode 13a, with molybdenum nitride (MoN) and aluminum (Al) laminated in the upper layer and the lower layer, respectively.

The bias line layer 1601 a is formed with the same material as that of the bias line 16, and in the present example, it has a structure obtained by laminating molybdenum nitride (MoN) in the upper layer, aluminum (Al) in the intermediate layer, and molybdenum nitride (MoN) in the lower layer.

The terminal structure in the present modification example can be produced simultaneously in the step of producing the active area, as is the case with Embodiment 1 described above. In this case, as is the case with the step shown in FIG. 6A, the gate layer 110 is formed, and thereafter, the gate insulating film 102 and the semiconductor layer 130 are formed so as to cover the gate layer 110. Then, as is the case with the step shown in FIG. 6B, the semiconductor layer 130 is patterned and the semiconductor layer 130 in the terminal area is removed. Thereafter, a metal film for forming the source electrode 13c and the drain electrode 13d is formed on the gate insulating film 102, and the metal film provided in the terminal area is removed by wet etching carried out when the source electrode 13c and the drain electrode 13d are formed. Here, as the gate insulating film 102 is provided on the gate layer 110, the wet etching does not cause the gate layer 110 to disappear.

Further, as is the case with the steps shown in FIGS. 6D and 6E, the first insulating film 103 is formed on the gate insulating film 102, and the second insulating film 104 is formed on the first insulating film 103, but the second insulating film 104 formed in the terminal area is removed by wet etching.

Next, as is the case with the step shown in FIG. 6F, the metal film 140 for forming the lower electrode 14 in the TFT area is formed in the terminal area as well, but the metal film 140 in the terminal area is removed by wet etching carried out for forming the lower electrode 14. Here, as the gate layer 110 is covered with the gate insulating film 102 and the first insulating film 103, this wet etching does not cause the gate layer 110 to disappear.

Thereafter, as is the case with the steps shown in FIGS. 6G to 6I, the photoelectric conversion layer 15 and the upper electrode 14b are formed in the TFT area, but the etching carried out for forming these does not cause the gate layer 110 to disappear, as the gate layer 110 is covered with the gate insulating film 102 and the first insulating film 103.

Further, thereafter, as is the case with the step shown in FIG. 6K, the third insulating film 105 is formed on the first insulating film 103, and the third insulating film 105 is patterned by photolithography and wet etching. Through these steps, the contact hole CH33 passing through the third insulating film 105, the first insulating film 103, and the gate insulating film 102 is formed in the terminal area, on the gate layer 110.

As is the case with the steps shown in FIGS. 6L to 6N, the fourth insulating film 106 is formed in the TFT area, and the metal film 160 for forming the bias line 16 is formed in the TFT area and the terminal area. The metal film 160 is patterned by photolithography and wet etching, and the bias line 16 is formed on the fourth insulating film 106 in the TFT area. Here, the bias line layer 1601a connected with the gate layer 110 through the contact hole CH33 is formed in the terminal area.

Thereafter, steps identical to those shown in FIGS. 6O to 6S are carried out, whereby the transparent conductive film 1701 is formed on the bias line layer 1601a in the terminal area, and the fifth insulating film 107 is formed on an outer side with respect to the contact hole CH33, on the transparent conductive film 1701.

Incidentally, the above-described example is described with reference to an exemplary configuration in which the bias line layer 1601a is provided as the cover layer, but the configuration may be such that a lower electrode layer or the source layer is provided in place of the bias line layer. In a case where the lower electrode layer is provided as the cover layer, the lower electrode layer may be formed with such a material that the etching carried out for forming the bias line 16 does not cause the lower electrode layer to disappear. For example, in a case where the bias line 16 has a structure obtained by laminating molybdenum nitride (MoN) in the upper layer, aluminum (Al) in the intermediate layer, and molybdenum nitride (MoN) in the lower layer, the lower electrode 14 may be formed with a laminate of molybdenum nitride (MoN) in the upper layer and titanium (Ti) in the lower layer. Molybdenum nitride (MoN) provided in the upper layer of the lower electrode layer is removed by the wet etching carried out for forming the bias line 16, but titanium (Ti) in the lower layer is not removed, because the etch selectivity of titanium (Ti) with respect to molybdenum nitride (MoN) is high in the wet etching, thereby resulting in that the pad portion does not disappear.

Further, in a case where the source layer is provided as a cover layer, the source layer may be formed with such a material that the etching carried out for forming the lower electrode 14 and the bias line 16 does not cause the source layer to disappear. For example, the following case is assumed: the bias line 16 has a structure obtained by laminating molybdenum nitride (MoN), aluminum (Al), and molybdenum nitride (MoN) in the upper layer, the intermediate layer, and the lower layer, respectively, and the lower electrode 14 is made of molybdenum nitride (MoN). In such as case, titanium (Ti), aluminum (Al), and titanium (Ti) may be laminated in the upper layer, the intermediate layer, and the lower layer, respectively, as materials for the source electrode 13c. The etch selectivity of titanium (Ti) provided in the upper layer of the source layer with respect to molybdenum nitride (MoN) is high in wet etching carried out when the lower electrode 14 and the bias line 16 are formed, thereby resulting in that the pad portion does not disappear.

Figure 15:
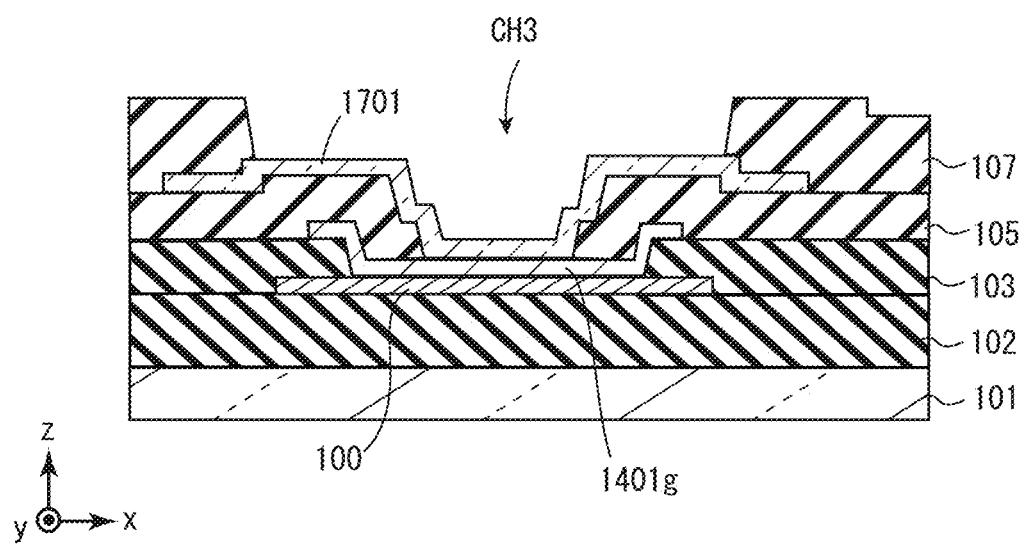
FIG. 15 is a cross-sectional view showing an exemplary structure of a G terminal, an S terminal and a B terminal in Modification Example (6), which is different from the structure shown in FIG. 14.

In the exemplary terminal structure shown in FIG. 14, only the bias line layer 1601a is provided as the cover layer, but alternatively, the configuration may be such that only the lower electrode layer is provided. FIG. 15 is a cross-sectional view showing an exemplary terminal structure in which only the lower electrode layer is provided in the cover layer. In FIG. 15, the same constituent members as those in Embodiment 1 are denoted by the same reference symbols as those in FIG. 14.

In the G terminal 391, the S terminal 392, and the B terminal 393 shown in FIG. 15, a lower electrode layer 1401g is provided as a cover layer on the source layer 100 that is the pad portion; and the gate layer 110, the lower electrode layer 1401g, and the transparent conductive film 1701 are connected in the contact hole CH34.

In this example, the lower electrode 14 has a laminate structure obtained by laminating molybdenum nitride (MoN) and titanium (Ti) in the upper layer and the lower layer, respectively. The lower electrode layer 1401g is formed in the step of forming the lower electrode 14, with the same material as that of the lower electrode 14, but the lower electrode layer 1401g is finally formed with titanium (Ti) alone, as a result of the etching carried out when the lower electrode 14 is formed. The following description describes a method for producing this terminal structure.

In this case, steps identical to those shown in FIGS. 6A to 6F are carried out, whereby the lower electrode layer 1401g connected with the source layer 100 through the opening 103a in the first insulating film 103 is formed in the terminal area. The lower electrode layer 1401g formed here has a structure obtained by laminating molybdenum nitride (MoN) and titanium (Ti) in the upper layer and the lower layer, respectively, as is the case with the lower electrode 14.

Thereafter, steps identical to those shown in FIGS. 6G to 6N are carried out, whereby the metal film 160 for forming the bias line 16 is formed in the TFT area and the terminal area; then, wet etching is carried out with respect to the metal film 160 in the step shown in FIG. 6O, which causes the bias line 16 to be formed in the TFT area, and causes the metal film 160 in the terminal area to be removed. The metal film 160 has a structure obtained by laminating molybdenum nitride (MoN) in the upper layer, aluminum (Al) in the intermediate layer, and molybdenum nitride (MoN) in the lower layer.

Here, the top of the source layer 100, which is the pad portion, is covered with the lower electrode layer 1401g, and the wet etching with respect to the metal film 160 causes the metal film 160 in the terminal area to be removed, while causing molybdenum nitride (MoN) provided in the upper layer of the lower electrode layer 1601g to be removed. Titanium (Ti) provided in the lower layer of the lower electrode layer 1601g remains, because the etch selectivity of the same with respect to molybdenum nitride (MoN) is high in wet etching. The source layer 100, which is the pad portion, is therefore covered with the lower electrode layer 1401g formed with titanium (Ti), thereby not disappearing in the etching step for forming the bias line 16. Thereafter, steps identical to those shown in FIG. 6Q to 6U are carried out, whereby the G terminal 391, the S terminal 392, and the B terminal 393 are formed.

Incidentally, molybdenum nitride (MoN) in the lower layer of the metal film 160 described above may be replaced with titanium (Ti). In this case, the metal film 160 is wet-etched, whereby molybdenum nitride (MoN) in the upper layer and aluminum (Al) in the intermediate layer are etched, and thereafter, dry etching with chlorine-based gas is carried out, whereby titanium (Ti) in the lower layer of the metal film 160 is etched. Here, the source layer 100, which is the pad portion, is covered with the lower electrode layer 1401g. The etch selectivity of molybdenum nitride (MoN) provided in the upper layer of the lower electrode layer 1401g with respect to titanium (Ti) in the lower layer of the metal film 160 is high in dry etching. Further, the film of titanium (Ti) in the lower layer of the metal film 160 is thin, and etching of the same requires only short time. Consequently, the lower electrode layer 1401g does not disappear.

The above-described example shown in FIG. 15 is described with reference to an exemplary configuration in which the lower electrode layer 1401g is provided as a cover layer, but the configuration may be such that a bias line layer is provided in place of the lower electrode layer, or such that the lower electrode layer 1401g and the bias line layer are provided. In the case where the bias line layer is formed in place of the lower electrode layer, though the illustration is omitted, the source layer 100, which is to become the pad portion, is covered with the first insulating film 103 before the lower electrode 14 is formed. The etching carried out when the lower electrode 14 is formed therefore does not cause the pad portion to disappear.

(7) The above-described embodiments and modification examples are described with reference to an exemplary configuration in which the gate layer or the source layer is used for forming the pad portion, but the members for the pad portion are not limited to these. For example, a lower electrode layer formed with the same material as that for the lower electrode may be used for the pad portion. FIG. 16 is a cross-sectional view showing the G terminal, the S terminal, and the B terminal in a case where a lower electrode layer is used for forming the pad portion. As shown in FIG. 16, in each of the G terminal 3101, the S terminal 3102, and the B terminal 3103 according to the present modification example, the lower electrode layer 1401 is provided on the first insulating film 103, and the third insulating film 105 having the opening 105*a* is provided on the lower electrode layer 1401. On the third insulating film 105, the conductive film 1701 connected with the lower electrode layer 1401 through the opening 105*a* is provided. As the lower electrode layer 1401 is covered with the bias line layer 1601, the etching carried out when the bias line 16 is formed does not cause the lower electrode layer 1401 to disappear.

(8) The above-described modification examples are described with reference to an exemplary configuration in which aluminum (Al) is contained in the material for the gate electrode, the source electrode, and the bias line in order to reduce the resistance, but the material used for reducing the resistance is not limited to aluminum (Al). For example, in place of aluminum (Al), the following material may be contained: copper (Cu); an alloy containing silver (Ag) and aluminum (Al); or an alloy containing copper (Cu) or silver (Ag).

The invention claimed is:

1. An imaging panel that generates an image based on scintillation light that is obtained from X-rays transmitted through an object, the imaging panel comprising a substrate,
    wherein the imaging panel has an active area and a terminal area on the substrate,
    the imaging panel further comprising, in the active area:
    a thin film transistor formed on the substrate;
    a first insulating film provided on the thin film transistor;
    a lower electrode provided on the first insulating film;
    a photoelectric conversion layer that is provided on the lower electrode and converts the scintillation light into charges;
    an upper electrode provided on the photoelectric conversion layer;
    a second insulating film arranged on the upper electrode so as to have separation to have a contact hole;
    a conductive film that is arranged on the second insulating film and is connected with the upper electrode through the contact hole; and
    a bias line that is arranged on the second insulating film and is connected with the conductive film,
    the imaging panel further comprising, in the terminal area:
    a first conductive layer that is provided on the substrate and is connected with a gate electrode or a source electrode of the thin film transistor;
    a terminal first insulating film that is made of the same material as that of the first insulating film or the second insulating film, and is arranged so as to have separation on a part of the first conductive layer to have a first opening;
    a second conductive layer that is made of the same material as that of the conductive film, is provided above the terminal first insulating film, and overlaps with the first conductive layer at a position where the first opening is provided; and
    a cover layer that is arranged between the first conductive layer and the second conductive layer so as to overlap with the first conductive layer and the second conductive layer at the position where the first opening is provided,
    wherein the first conductive layer is made of the same material as that of any one element of the gate electrode, the source electrode, and the lower electrode, and
    the cover layer is made of the same material as that of at least one element arranged in an upper layer with respect to the element made of the same material as that of the first conductive layer, among the source electrode, the lower electrode, and the bias line.

2. The imaging panel according to claim 1,
    wherein, in a case where the first conductive layer is made of the same material as that of the source electrode, the cover layer is composed of a lower electrode layer made of the same material as that of the lower electrode, and a bias line layer made of the same material as that of the bias line.

3. The imaging panel according to claim 1,
    wherein, in a case where the first conductive layer is made of the same material as that of the gate electrode, the cover layer is composed of at least two layers of a lower electrode layer made of the same material as that of the lower electrode, a bias line layer made of the same material as that of the bias line, and a source layer made of the same material as that of the source electrode.

4. The imaging panel according to claim 1,
    wherein a plurality of terminals are provided in the terminal area, and
    in the terminal area, the first conductive layer in an area where at least one of the terminals is provided is connected with the gate electrode, and the first conductive layer in an area where another one of the terminals is provided is connected with the source electrode.

5. The imaging panel according to claim 1,
    wherein the gate electrode and the source electrode of the thin film transistor, the lower electrode, as well as the bias line contain one same material.

6. An imaging panel producing method for producing an imaging panel that generates an image based on scintillation light that is obtained from X-rays transmitted through an object, the method comprising the steps of, in an active area on a substrate:
    forming a thin film transistor;
    forming a first insulating film on the thin film transistor;
    forming, on a drain electrode of the thin film transistor, a first contact hole that passes through the first insulating film, and forming a lower electrode conductive film that covers the first insulating film;
    etching the lower electrode conductive film, so as to form a lower electrode on the first insulating film so that the lower electrode is connected with the drain electrode through the first contact hole;
    forming a photoelectric conversion layer on the lower electrode, and forming an upper electrode on the photoelectric conversion layer;
    forming a second insulating film that covers the upper electrode, and forming a second contact hole that pass through the second insulating film;
    forming a bias line conductive film above the second insulating film, and etching the bias line conductive film, so as to form a bias line to which a bias voltage is applied; and
    forming a conductive film that is connected with the upper electrode through the second contact hole,
    wherein the step of forming the thin film transistor or the step of forming the lower electrode includes a sub-step of forming a first conductive layer in a terminal area on the substrate, the first conductive layer being made of the same material as that of any one element of the gate electrode and the source electrode of the thin film transistor, and the lower electrode,
    the step of forming the first insulating film or the step of forming the second insulating film includes a sub-step of forming a terminal first insulating film that is made of the same material as that of the first insulating film or the second insulating film and has a first opening on a part of the first conductive layer, the step of forming the conductive film includes a sub-step of forming a second conductive layer that is made of the same material as that of the conductive film and overlaps with the first conductive layer above the terminal first insulating film, at a position where the first opening is provided, and the step of forming at least one element arranged in an upper layer with respect to the element made of the same material as that of the first conductive layer, the at least one element being among the source electrode, the lower electrode, and the bias line, includes a sub-step of forming a cover layer that is made of the same material as that of the at least one element, and is arranged at a position where the first opening is provided, so as to be interposed between the first conductive layer and the second conductive layer.

7. The imaging panel producing method according to claim 6, wherein the first conductive layer contains such a material that, in etching that is carried out in the step of forming the element arranged in an upper layer with respect to the element made of the same material as that of the first conductive layer, among the source electrode, the lower electrode, and the bias line, an etch selectivity of the material with respect to the former element is high.

8. The imaging panel producing method according to claim 6, wherein a lowermost layer in the cover layer in contact with the first conductive layer contains such a material that, in etching that is carried out in the step of forming an element arranged in an upper layer with respect to an element made of the same material as that of the lowermost layer among the source electrode, the lower electrode, and the bias line, an etch selectivity of the material with respect to the former element is high.

9. The imaging panel producing method according to claim 8, wherein the cover layer includes a source layer that is formed in the step in which the source electrode of the thin film transistor is formed and is made of the same material as that of the source electrode, and a bias line layer that is formed in the step in which the bias line is formed and is made of the same material as that of the bias line, wherein, in the terminal area, in the step of forming the second insulating film, a terminal second insulating film that is made of the same material as that of the second insulating film, covers the terminal first insulating film, and has a second opening inside the first opening, is formed, the source layer is connected with the first conductive layer at the first opening, the terminal first insulating film is formed on a part of the source layer, the bias line layer is formed on the terminal second insulating film, and is connected with the source layer at the second opening, and the second conductive layer is connected with the first conductive layer at the second opening, which overlaps with the first opening, via the cover layer.

10. The imaging panel producing method according to claim 9, wherein the source electrode and the source layer are formed by laminating a first material that exhibits a high etch rate in etching carried out when the lower electrode is formed, and a second material that exhibits a low etch rate in the etching, the second insulating film and the terminal second insulating film have a thickness greater than that of the film of the first material, and the bias line and the bias line layer are formed with a plurality of layers containing the first material, and the bias line and the bias line layer have a thickness greater than that of the film of the first material in the source electrode and the source layer.

11. The imaging panel producing method according to claim 6, wherein the element not used for forming the cover layer, among the source electrode, the lower electrode, and the bias line, has a laminate structure obtained by laminating a plurality of materials, and in etching carried out in the step of forming the said element, an etch selectivity of the lowermost layer of the laminate structure with respect to elements provided in a lower layer with respect to the said element is low.

* * * * *